United States Patent
Lan et al.

(10) Patent No.: US 10,742,249 B2
(45) Date of Patent: Aug. 11, 2020

(54) METHOD FOR CONTROLLING SPECIFIC ABSORPTION RATE OF WIRELESS COMMUNICATIONS DEVICE AND WIRELESS COMMUNICATIONS DEVICE

(71) Applicant: Huawei Technologies Co., Ltd., Shenzhen (CN)

(72) Inventors: Yuan-Hao Lan, Shanghai (CN); Hsingyu Lung, Shanghai (CN); Chien-Jen Huang, Shanghai (CN); Haw-Wei Shu, Shanghai (CN); Chih-Wei Hsu, Taipei (TW)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/317,703

(22) PCT Filed: Jul. 12, 2016

(86) PCT No.: PCT/CN2016/089828
§ 371 (c)(1),
(2) Date: Jan. 14, 2019

(87) PCT Pub. No.: WO2018/010100
PCT Pub. Date: Jan. 18, 2018

(65) Prior Publication Data
US 2019/0356349 A1    Nov. 21, 2019

(51) Int. Cl.
*H04B 1/3827* (2015.01)
*H04B 17/10* (2015.01)
(Continued)

(52) U.S. Cl.
CPC ....... *H04B 1/3838* (2013.01); *G01R 29/0814* (2013.01); *H04B 17/102* (2015.01); *H04W 52/24* (2013.01); *H04W 52/367* (2013.01)

(58) Field of Classification Search
CPC .............................. H04B 17/18; H04B 1/3838
See application file for complete search history.

(56) References Cited

U.S. PATENT DOCUMENTS

| 8,934,852 B2 | 1/2015 | Yan et al. |
|---|---|---|
| 2006/0139216 A1 | 6/2006 | Glocker et al. |

(Continued)

FOREIGN PATENT DOCUMENTS

| CN | 100508278 C | 7/2009 |
|---|---|---|
| CN | 101710644 A | 5/2010 |

(Continued)

OTHER PUBLICATIONS

Foreign Communication From A Counterpart Application, European Application No. 16908429.0, Extended European Search Report dated Jun. 3, 2019, 8 pages.

(Continued)

*Primary Examiner* — Hsinchun Liao
(74) *Attorney, Agent, or Firm* — Conley Rose, P.C.

(57) ABSTRACT

A method for controlling a specific absorption rate (SAR) of a wireless communications device and a wireless communications device, and the wireless communications device includes a first antenna and a second antenna. The method includes transmitting, by the wireless communications device, a radio frequency signal using the first antenna, and stopping using the first antenna and starting transmitting the radio frequency signal using the second antenna when transmit power of the first antenna is greater than first preset power and a first time period elapses to enable the wireless communications device to meet an SAR standard. There is no backoff of antenna transmit power in a process of controlling the SAR of the wireless communications device. Therefore, communication quality of the wireless communications device is ensured while the SAR standard is met.

20 Claims, 23 Drawing Sheets

(51) Int. Cl.
    *G01R 29/08*   (2006.01)
    *H04W 52/24*   (2009.01)
    *H04W 52/36*   (2009.01)

(56) References Cited

U.S. PATENT DOCUMENTS

| | | |
|---|---|---|
| 2012/0021800 A1 | 1/2012 | Wilson et al. |
| 2012/0062424 A1 | 3/2012 | Hwang |
| 2012/0190398 A1 | 7/2012 | Leukkunen |
| 2013/0252658 A1 | 9/2013 | Wilson et al. |
| 2014/0370929 A1 | 12/2014 | Khawand et al. |
| 2016/0098053 A1 | 4/2016 | Khawand et al. |
| 2016/0174168 A1 | 6/2016 | Lu et al. |

FOREIGN PATENT DOCUMENTS

| | | |
|---|---|---|
| CN | 102386950 A | 3/2012 |
| CN | 102570051 A | 7/2012 |
| CN | 102573126 A | 7/2012 |
| CN | 104426590 A | 3/2015 |
| CN | 105359420 A | 2/2016 |
| EP | 2424125 A1 | 2/2012 |
| KR | 20050080676 A | 8/2005 |
| WO | 2011058128 A1 | 5/2011 |

OTHER PUBLICATIONS

Machine Translation and Abstract of Chinese Publication No. CN101710644, May 19, 2010, 19 pages.
Machine Translation and Abstract of Chinese Publication No. CN102573126, Jul. 11, 2012, 19 pages.
Machine Translation and Abstract of Chinese Publication No. CN104426590, Mar. 18, 2015, 13 pages.
Kanda, M., et al. "Faster Determination of Mass-Averaged SAR From 2-D Area Scans," IEEE Transactions on Microwave Theory and Techniques, vol. 52, No. 8, Aug. 2004, pp. 2013-2020.
Foreign Communication From A Counterpart Application, PCT Application No. PCT/CN2016/089828, English Translation of International Search Report dated Mar. 30, 2017, 3 pages.
Foreign Communication From A Counterpart Application, PCT Application No. PCT/CN2016/089828, English Translation of Written Opinion dated Mar. 30, 2017, 4 pages.

METHOD FOR CONTROLLING SPECIFIC ABSORPTION RATE OF WIRELESS COMMUNICATIONS DEVICE AND WIRELESS COMMUNICATIONS DEVICE

CROSS-REFERENCE TO RELATED APPLICATIONS

This application is a U.S. National Stage of International Patent Application No. PCT/CN2016/089828 filed on Jul. 12, 2016, which is hereby incorporated by reference in its entirety.

TECHNICAL FIELD

Embodiments of the present invention relate to the communications field, and more specifically, to a technology of controlling radio-frequency radiation of a wireless communications device.

BACKGROUND

A wireless communications device controls, by using a radio frequency (radio frequency, RF for short) circuit, an antenna to receive and send a radio frequency signal (radio frequency signal), and transmit a radio frequency signal (data transmission), for example, during a voice call or web page browsing. However, the radio frequency signal generates RF radiation, for example, electromagnetic radiation (electromagnetic radiation). RF radiation whose frequency band range is from 3 kilohertz (kHz) to 300 Gigahertz (GHz) damages a human body after the RF radiation is absorbed by the human body. Usually, RF radiation energy that is absorbed by the human body from the wireless communications device is internationally measured by using a specific absorption rate (Specific Absorption Rate, SAR for short). The SAR measures RF radiation energy absorbed by a substance per unit mass in a unit time, and a unit is watt per kilogram (W/kg).

Currently, a specified upper limit value is set for an SAR value of the wireless communications device in some countries, so as to ensure that wireless communications devices introduced to these countries do not cause excessively high RF radiation. For example, both the US Federal Communications Commission (Federal Communications Commission, FCC for short) and the European CE (Conformite Europeenne) specify an SAR standard (SAR compliance criteria) of the wireless communications device. In an SAR standard specified by the US FCC, an SAR upper limit value of the wireless communications device is 1.6 W/kg. That is, RF radiation energy absorbed by each kilogram of human tissue in six minutes is not more than 2 watts (W). In an SAR standard specified by the European CE, an SAR upper limit value of the wireless communications device is 2 W/kg. In two papers entitled "Standard for Safety Levels with Respect to Human Exposure to Radio Frequency Electromagnetic Fields, 3 KHz to 300 GHz" (C95.1-1992) and "Recommended Practice for Measurement of Potentially Hazardous Electromagnetic Fields-RF and Microwave" (C95.3-2002) that are published in the Institute of Electrical and Electronics Engineers (Institute of Electrical and Electronics Engineers, IEEE for short) and the American National Standards Institute (American National Standards Institute, ANSI for short), content of the SAR standard is specifically described.

A method for measuring the SAR value of the wireless communications device is to measure an average RF radiation energy absorption rate at one point of each kilogram of human tissue in a period of time. An SAR calculation formula is:

$$SAR = \frac{\sigma \cdot E^2}{\rho},$$

where σ is electric conductivity of an absorber (for example, a phantom) that simulates human tissue, E is a variance (Root Mean Squared, RMS) of electric intensity caused when the wireless communications device generates a radio frequency signal, and p is mass density of the absorber that simulates the human tissue.

A value of electric intensity generated when a radio frequency signal is received or sent by using an antenna is related to transmit power of the antenna. When the transmit power of the antenna is high, electric intensity around the wireless communications device increases, and RF radiation energy correspondingly increases. The SAR value of the wireless communications device may not meet the SAR standard (referred to as "the SAR value of the wireless communications device exceeds a limit" below). FIG. 1a is a schematic diagram of a scenario in which an SAR value of a wireless communications device exceeds a limit. As shown in FIG. 1a, when transmission is performed by using an antenna 1 of the wireless communications device at maximum transmit power, an SAR value generated by the device exceeds a limit. Therefore, to meet a requirement of the foregoing countries for the SAR value of the wireless communications device, the SAR value of the wireless communications device is usually controlled by using a power backoff (Power Backoff) mechanism in the prior art. The power backoff mechanism allows to reduce transmit power of an antenna of the wireless communications device, so as to reduce the SAR value of the wireless communications device.

FIG. 1b is a schematic diagram of reducing an SAR value by using a power backoff mechanism. As shown in FIG. 1b, when transmit power of an antenna decreases, generated RF radiation energy decreases, so that an SAR value of a wireless communications device meets an SAR standard. However, when the transmit power of the antenna decreases, communication performance of the wireless communications device deteriorates. If the wireless communications device is in a weak signal area with relatively poor signal quality, it is likely that a call drop occurs or uplink call quality is poor. FIG. 1c is a schematic diagram of a scenario in which call performance of a wireless communications device deteriorates after antenna transmit power decreases. Therefore, how to ensure communication quality of a wireless communications device while taking account of an SAR standard of the wireless communications device in each country is a difficult subject.

SUMMARY

This application provides a method for controlling a specific absorption rate of a wireless communications device and a wireless communications device, so as to ensure communication quality while taking account of an SAR standard in each country.

According to a first aspect, an embodiment of the present invention provides a method for controlling a specific absorption rate of a wireless communications device, where the wireless communications device includes a first antenna and a second antenna, a distance between positions of the first antenna and the second antenna in the wireless communications device is greater than a preset spacing, and the method includes:

transmitting, by the wireless communications device, a radio frequency signal by using the first antenna; and stopping using the first antenna and starting transmitting the radio frequency signal by using the second antenna when transmit power of the first antenna is greater than first preset power and a first time period elapses, where the first preset power is equal to or less than transmit power that is of the first antenna and that is corresponding to an SAR upper limit value specified in an SAR standard; and a start moment of the first time period is a moment when the transmit power of the first antenna is greater than the first preset power, and a length of the first time period is less than test duration that is of an SAR test and that is specified in the SAR standard, so that the wireless communications device meets the SAR standard.

In a first possible implementation of the first aspect, before the transmit power of the first antenna is greater than the first preset power, the method further includes:

monitoring whether the transmit power of the first antenna is greater than the first preset power.

With reference to the first aspect or the first possible implementation of the first aspect, in a second possible implementation, the method further includes: stopping transmitting the radio frequency signal by using the second antenna and starting transmitting the radio frequency signal by using another antenna when a second time period elapses, where a start moment of the second time period is a moment of starting transmitting the radio frequency signal by using the second antenna; and the another antenna is an antenna other than the second antenna in the wireless communications device.

With reference to the second possible implementation of the first aspect, in a third possible implementation, the another antenna is the first antenna.

If the second antenna is a safety antenna, when the second antenna is switched back to the first antenna after the second time period elapses, the wireless communications device may transmit the radio frequency signal by using the first antenna as much as possible, so as to improve communication performance of the wireless communications device. If the second antenna is a non-safety antenna, when the second antenna is switched back to the first antenna after the second time period elapses, the second antenna may be prevented from causing an SAR value of the wireless communications device to exceed a limit.

With reference to any one of the first aspect or the first to the third possible implementations of the first aspect, in a fourth possible implementation, after the transmit power of the first antenna is greater than the first preset power, the method further includes:

detecting a distance between a human body and the first antenna;

determining whether the distance between the human body and the first antenna is less than a first detection distance, where the first detection distance is a distance that is between the wireless communications device and the human body during the SAR test and that is specified in the SAR standard; and if the transmit power of the first antenna is greater than the first preset power and the distance between the human body and the first antenna is less than the first detection distance, performing the step of stopping using the first antenna and starting transmitting the radio frequency signal by using the second antenna when a first time period elapses.

The distance between the wireless communications device and the human body is detected, so as to more precisely determine when to start antenna switching. When the distance between the wireless communications device and the human body is relatively far, an antenna switching operation does not need to be performed regardless of whether the transmit power of the first antenna is relatively high, so as to reduce power consumption and improve communication stability.

With reference to any one of the first aspect or the first to the fourth possible implementations of the first aspect, in a fifth possible implementation, the length of the first time period is preset in the wireless communications device.

With reference to the fifth possible implementation of the first aspect, in a sixth possible implementation, the stopping using the first antenna and starting transmitting the radio frequency signal by using the second antenna when transmit power of the first antenna is greater than first preset power and a first time period elapses includes: when the transmit power of the first antenna is greater than the first preset power, starting counting duration of transmitting the radio frequency signal by using the first antenna; and when the duration of transmitting the radio frequency signal by using the first antenna reaches the length of the first time period, stopping using the first antenna and starting transmitting the radio frequency signal by using the second antenna.

With reference to any one of the first aspect or the first to the fourth possible implementations of the first aspect, in a seventh possible implementation, radio-frequency radiation energy generated when the radio frequency signal is transmitted by using the first antenna in the first time period is less than or equal to first preset energy; and the first preset energy is equal to or less than radio-frequency radiation energy that is at the first antenna and that is corresponding to the SAR upper limit value specified in the SAR standard.

With reference to any one of the second to the seventh possible implementations of the first aspect, in an eighth possible implementation, a length of the second time period is preset in the wireless communications device.

With reference to any one of the second to the seventh possible implementations of the first aspect, in a ninth possible implementation, the method further includes:

determining a length of the second time period according to the radio-frequency radiation energy generated at the first antenna in the first time period.

With reference to either the eighth possible implementation or the ninth possible implementation of the first aspect, in a tenth possible implementation, the stopping transmitting the radio frequency signal by using the second antenna and starting transmitting the radio frequency signal by using another antenna when a second time period elapses includes:

when the wireless communications device starts transmitting the radio frequency signal by using the second antenna, starting counting duration of transmitting the radio frequency signal by using the second antenna and when the duration of transmitting the radio frequency signal by using the second antenna reaches the length of the second time period, stopping using the first antenna and starting transmitting the radio frequency signal by using the second antenna.

With reference to any one of the second to the seventh possible implementations of the first aspect, in an eleventh possible implementation, radio-frequency radiation energy generated when the radio frequency signal is transmitted by using the second antenna in the second time period is less than or equal to second preset energy; and the second preset energy is equal to or less than radio-frequency radiation energy that is at the second antenna and that is corresponding to the SAR upper limit value specified in the SAR standard.

With reference to any one of the second to the tenth possible implementations of the first aspect, in a twelfth possible implementation, the method further includes:

determining whether transmit power of the second antenna is greater than second preset power, where the second preset power is equal to or less than transmit power that is of the second antenna and that is corresponding to the SAR upper limit value specified in the SAR standard;

detecting a distance between the human body and the second antenna;

determining whether the distance between the human body and the second antenna is less than a second detection distance; and if the transmit power of the second antenna is greater than the second preset power and the distance between the human body and the second antenna is less than the second detection distance, determining that the length of the second time period is less than test duration that is of the SAR test and that is specified in the SAR standard, so that the wireless communications device meets the SAR standard.

With reference to any one of the second to the tenth possible implementations of the first aspect, in a thirteenth possible implementation, the method further includes:

determining whether transmit power of the second antenna is greater than second preset power, where the second preset power is equal to or less than transmit power that is of the second antenna and that is corresponding to the SAR upper limit value specified in the SAR standard; or determining whether a distance between the human body and the second antenna is greater than a second detection distance;

obtaining a transmission performance parameter of the second antenna if the transmit power of the second antenna is less than the second preset power or the distance between the human body and the second antenna is greater than the second detection distance; and prolonging the length of the second time period according to the transmission performance parameter of the second antenna.

According to another aspect, an embodiment of the present invention provides a method for controlling a specific absorption rate of a wireless communications device, where the wireless communications device includes a first antenna and a second antenna, a distance between positions of the first antenna and the second antenna in the wireless communications device is greater than a preset spacing, and the method includes: transmitting, by the wireless communications device, a radio frequency signal by using the first antenna and stopping using the first antenna and starting transmitting the radio frequency signal by using the second antenna when transmit power of the first antenna is greater than first preset power and a first time period elapses, where the first preset power is equal to or less than transmit power that is of the first antenna and that is corresponding to an SAR upper limit value specified in an SAR standard; and a start moment of the first time period is a moment when the transmit power of the first antenna is greater than the first preset power, and a length of the first time period needs to meet: when the radio frequency signal is transmitted in the first time period at maximum transmit power of the first antenna, an SAR value at the first antenna is equal to or less than the SAR upper limit value specified in the SAR standard, so that the wireless communications device meets the SAR standard.

Any possible implementation of the first aspect may form a plurality of possible implementations in combination with this aspect.

According to another aspect, an embodiment of the present invention provides a method for controlling a specific absorption rate of a wireless communications device, where the wireless communications device includes a first antenna and a second antenna, a distance between positions of the first antenna and the second antenna in the wireless communications device is greater than a preset spacing, and the method includes: transmitting, by the wireless communications device, a radio frequency signal by using the first antenna; stopping using the first antenna and starting transmitting the radio frequency signal by using the second antenna when transmit power of the first antenna is greater than first preset power and a first time period elapses; and stopping transmitting the radio frequency signal by using the second antenna and starting transmitting the radio frequency signal by using the first antenna when transmit power of the second antenna is greater than second preset power and a second time period elapses, where the first preset power is equal to or less than transmit power that is of the first antenna and that is corresponding to an SAR upper limit value specified in an SAR standard, the second preset power is equal to or less than transmit power that is of the second antenna and that is corresponding to the SAR upper limit value specified in the SAR standard, a length of the first time period is one second, and a length of the second time period is one second.

Before an SAR value of the wireless communications device exceeds a limit, transmitting a radio frequency signal by using the antenna is stopped, and RF radiation energy that is accumulated at the antenna stops increasing, and is gradually reduced and released over time, so as to prevent the SAR value of the wireless communications device from exceeding a limit. In addition, because there is no backoff of antenna transmit power, communication performance of the wireless communications device is improved in comparison with a technical solution of power backoff.

According to a second aspect, an embodiment of the present invention provides a wireless communications device, and the wireless communications device includes:

a first antenna, configured to transmit a radio frequency signal;

a second antenna, configured to transmit a radio frequency signal, where a distance between positions of the first antenna and the second antenna in the wireless communications device is greater than a preset spacing;

a radio frequency circuit, communicatively connected to the first antenna or the second antenna; and a processor, communicatively connected to the radio frequency circuit, where the radio frequency circuit is connected to the first antenna, so as to transmit a radio frequency signal by using the first antenna, when transmit power of the first antenna is greater than first preset power;

the processor is configured to: when a first time period elapses, instruct the radio frequency circuit to stop using the first antenna and to start transmitting the radio frequency signal by using the second antenna, so that the wireless communications device meets an SAR standard;

the first preset power is equal to or less than transmit power that is of the first antenna and that is corresponding to an SAR upper limit value specified in the SAR standard; and a start moment of the first time period is a moment when the transmit power of the first antenna is greater than the first preset power, and a length of the first time period is less than test duration that is of an SAR test and that is specified in the SAR standard.

In a first possible implementation of the second aspect, the processor is further configured to:

monitor whether the transmit power of the first antenna is greater than the first preset power.

With reference to the second aspect or the first possible implementation of the second aspect, in a second possible implementation, the processor is further configured to:

when a second time period elapses, instruct the radio frequency circuit to stop transmitting the radio frequency signal by using the second antenna and to start transmitting the radio frequency signal by using another antenna, where a start moment of the second time period is a moment of starting transmitting the radio frequency signal by using the second antenna; and the another antenna is an antenna other than the second antenna in the wireless communications device.

With reference to the second possible implementation of the second aspect, in a third possible implementation, the another antenna is the first antenna.

With reference to any one of the second aspect or the first to the third possible implementations of the second aspect, in a fourth possible implementation, the wireless communications device further includes:

a first sensor, configured to detect a distance between a human body and the first antenna; and the processor is further configured to:

determine whether the distance between the human body and the first antenna is less than a first detection distance, where the first detection distance is a distance that is between the wireless communications device and the human body during the SAR test and that is specified in the SAR standard; and if the transmit power of the first antenna is greater than the first preset power and the distance between the human body and the first antenna is less than the first detection distance, stop using the first antenna and start transmitting the radio frequency signal by using the second antenna when the first time period elapses.

With reference to any one of the second aspect or the first to the fourth possible implementations of the second aspect, in a fifth possible implementation, the length of the first time period is preset in the wireless communications device.

With reference to the fifth possible implementation of the second aspect, in a sixth possible implementation, the processor is further configured to:

when the transmit power of the first antenna is greater than the first preset power, start counting duration of transmitting the radio frequency signal by using the first antenna; and when the duration of transmitting the radio frequency signal by using the first antenna reaches the length of the first time period, instruct the radio frequency circuit to stop using the first antenna and to start transmitting the radio frequency signal by using the second antenna.

With reference to any one of the second aspect, or the first to the fourth possible implementations of the second aspect, in a seventh possible implementation, radio-frequency radiation energy generated when the radio frequency signal is transmitted by using the first antenna in the first time period is less than or equal to first preset energy; and the first preset energy is equal to or less than radio-frequency radiation energy that is at the first antenna and that is corresponding to the SAR upper limit value specified in the SAR standard.

With reference to any one of the second to the seventh possible implementations of the second aspect, in an eighth possible implementation, a length of the second time period is preset in the wireless communications device.

With reference to any one of the second to the seventh possible implementations of the second aspect, in a ninth possible implementation, the processor is further configured to:

determine a length of the second time period according to the radio-frequency radiation energy generated at the first antenna in the first time period.

With reference to either the eighth possible implementation or the ninth possible implementation of the second aspect, in a tenth possible implementation, the processor is further configured to:

when the wireless communications device starts transmitting the radio frequency signal by using the second antenna, start counting duration of transmitting the radio frequency signal by using the second antenna; and when the duration of transmitting the radio frequency signal by using the second antenna reaches the length of the second time period, instruct the radio frequency circuit to stop using the first antenna and to start transmitting the radio frequency signal by using the second antenna.

With reference to any one of the second to the seventh possible implementations of the second aspect, in an eleventh possible implementation, radio-frequency radiation energy generated when the radio frequency signal is transmitted by using the second antenna in the second time period is less than or equal to second preset energy; and the second preset energy is equal to or less than radio-frequency radiation energy that is at the second antenna and that is corresponding to the SAR upper limit value specified in the SAR standard.

With reference to any one of the second to the tenth possible implementations of the second aspect, in a twelfth possible implementation, the processor is further configured to:

determine whether transmit power of the second antenna is greater than second preset power, where the second preset power is equal to or less than transmit power that is of the second antenna and that is corresponding to the SAR upper limit value specified in the SAR standard;

the wireless communications device further includes:

a second sensor, configured to detect a distance between the human body and the second antenna; and the processor is further configured to:

determine whether the distance between the human body and the second antenna is less than a second detection distance; and if the transmit power of the second antenna is greater than the second preset power and the distance between the human body and the second antenna is less than the second detection distance, determine that the length of the second time period is less than test duration that is of the SAR test and that is specified in the SAR standard, so that the wireless communications device meets the SAR standard.

With reference to any one of the second to the tenth possible implementations of the second aspect, in a thirteenth possible implementation, the processor is further configured to:

determine whether transmit power of the second antenna is greater than second preset power, where the second preset power is equal to or less than transmit power that is of the second antenna and that is corresponding to the SAR upper limit value specified in the SAR standard; obtain a transmission performance parameter of the second antenna if the transmit power of the second antenna is less than the second preset power; and prolong the length of the second time period according to the transmission performance parameter of the second antenna; or the wireless communications device further includes:

a second sensor, configured to detect a distance between the human body and the second antenna; and the processor is further configured to:

determine whether the distance between the human body and the second antenna is greater than a second detection distance; obtain a transmission performance parameter of the second antenna if the distance between the human body and the second antenna is greater than the second detection distance; and prolong the length of the second time period according to the transmission performance parameter of the second antenna.

According to another aspect, an embodiment of the present invention provides a wireless communications device, and the wireless communications device includes a first antenna, a second antenna, a radio frequency circuit, and a processor, where the first antenna is configured to transmit a radio frequency signal;

the second antenna is configured to transmit a radio frequency signal, where a distance between positions of the first antenna and the second antenna in the wireless communications device is greater than a preset spacing;

the radio frequency circuit is communicatively connected to the first antenna or the second antenna and the processor is communicatively connected to the radio frequency circuit, where the radio frequency circuit is connected to the first antenna, so as to transmit a radio frequency signal by using the first antenna, when transmit power of the first antenna is greater than first preset power;

the processor is configured to: when the transmit power of the first antenna is greater than the first preset power and a first time period elapses, stop using the first antenna and start transmitting the radio frequency signal by using the second antenna, where the first preset power is equal to or less than transmit power that is of the first antenna and that is corresponding to an SAR upper limit value specified in an SAR standard; and a start moment of the first time period is a moment when the transmit power of the first antenna is greater than the first preset power, and a length of the first time period needs to meet: when the radio frequency signal is transmitted in the first time period at maximum transmit power of the first antenna, an SAR value at the first antenna is equal to or less than the SAR upper limit value specified in the SAR standard, so that the wireless communications device meets the SAR standard.

Any possible implementation of the second aspect may form a plurality of possible implementations in combination with this aspect.

According to another aspect, an embodiment of the present invention provides a wireless communications device, and the wireless communications device includes a first antenna, a second antenna, a radio frequency circuit, and a processor, where the first antenna is configured to transmit a radio frequency signal;

the second antenna is configured to transmit a radio frequency signal, where a distance between positions of the first antenna and the second antenna in the wireless communications device is greater than a preset spacing;

the radio frequency circuit is communicatively connected to the first antenna or the second antenna; and the processor is communicatively connected to the radio frequency circuit, where the radio frequency circuit is connected to the first antenna, so as to transmit a radio frequency signal by using the first antenna, when transmit power of the first antenna is greater than first preset power;

the processor is configured to: when the transmit power of the first antenna is greater than the first preset power and a first time period elapses, stop using the first antenna and start transmitting the radio frequency signal by using the second antenna; and when transmit power of the second antenna is greater than second preset power, and a second time period elapses, stop transmitting the radio frequency signal by using the second antenna and start transmitting the radio frequency signal by using the first antenna, where the first preset power is equal to or less than transmit power that is of the first antenna and that is corresponding to an SAR upper limit value specified in an SAR standard, the second preset power is equal to or less than transmit power that is of the second antenna and that is corresponding to the SAR upper limit value specified in the SAR standard, a length of the first time period is one second, and a length of the second time period is one second.

Before an SAR value of the wireless communications device exceeds a limit, transmitting a radio frequency signal by using the antenna is stopped, and RF radiation energy that is accumulated at the antenna stops increasing, and is gradually reduced and released over time, so as to prevent the SAR value of the wireless communications device from exceeding a limit. In addition, because there is no backoff of antenna transmit power, communication performance of the wireless communications device is improved in comparison with a power backoff technical solution.

According to a third aspect, an embodiment of the present invention provides a wireless communications device, including a first antenna, a second antenna, a radio frequency switching circuit, a processor, and a memory, where the radio frequency switching circuit, the processor, and the memory are connected by using a bus system;

the memory is configured to store an instruction;

the first antenna and the second antenna are configured to transmit a radio frequency signal according to control of the processor; and the processor is configured to invoke the instruction stored in the memory, so as to perform any possible implementation of the first aspect.

Before an SAR value of the wireless communications device exceeds a limit, transmitting a radio frequency signal by using the antenna is stopped, and RF radiation energy that is accumulated at the antenna stops increasing, and is gradually reduced and released over time, so as to prevent the SAR value of the wireless communications device from exceeding a limit. In addition, because there is no backoff of antenna transmit power, communication performance of the wireless communications device is improved in comparison with a power backoff technical solution.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 2b is a schematic structural diagram of an RF circuit 1110 of the wireless communications device in FIG. 2a;

FIG. 5a is a time sequence diagram of antenna transmit power of a wireless communications device when a second antenna is a safety antenna;

FIG. 5b is a time sequence diagram of antenna transmit power of a wireless communications device when a second antenna is a non-safety antenna;

FIG. 6a is a time sequence diagram of antenna transmit power of a wireless communications device when a second antenna is a safety antenna;

FIG. 6b is a time sequence diagram of antenna transmit power of a wireless communications device when a second antenna is a non-safety antenna;

FIG. 7a is a time sequence diagram of antenna transmit power of a wireless communications device when a second antenna is a safety antenna;

FIG. 7b is a time sequence diagram of antenna transmit power of a wireless communications device when a second antenna is a non-safety antenna;

DESCRIPTION OF EMBODIMENTS

The following clearly describes the technical solutions in some of the embodiments of the present invention with reference to the accompanying drawings in the embodiments of the present invention. The described embodiments are a part rather than all of the embodiments of the present invention. All other embodiments obtained by a person of ordinary skill in the art based on the embodiments of the present invention without creative efforts shall fall within the protection scope of the present invention.

In the embodiments of the present invention, a wireless communications device (wireless communication devices, or radio communications equipment) may also be referred to as user equipment (User Equipment, "UE" for short), a mobile station (Mobile Station, "MS" for short), a mobile terminal (Mobile terminal), a client (Station, "STA" for short), an electronic device (electronic device), or the like. The wireless communications device may be a data card, a router, an ebook, a mobile phone (or referred as a "cellular" phone), a portable computer, a tablet computer, a mobile phone, a media player, a personal digital assistant (PDA), an intelligent vehicle, a wireless communications device in a future 5G network, a wireless communications device in a future evolved PLMN network, or the like. The wireless communications device may communicate with the Internet or another communications device through wireless communication.

Figure 1A:
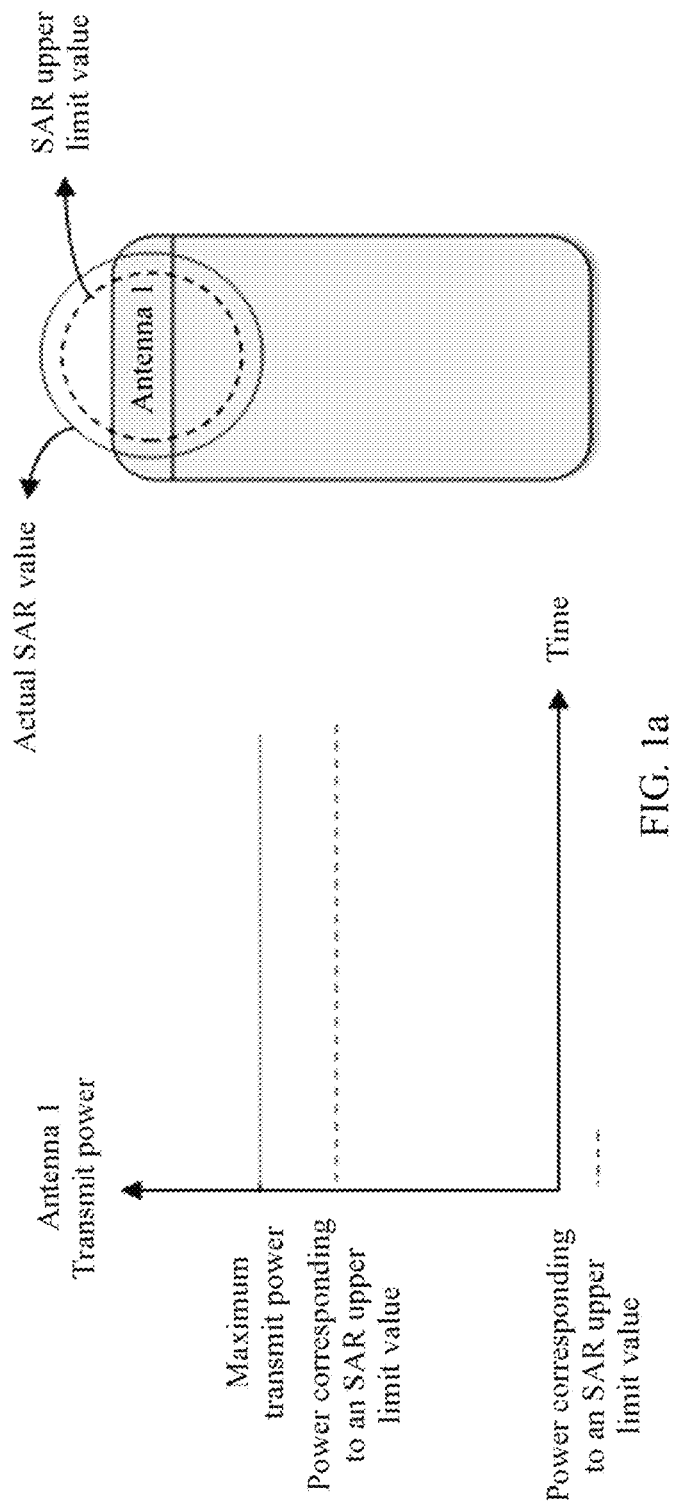
FIG. 1a is a schematic diagram of a scenario in which an SAR value of a wireless communications device exceeds a limit.
Figure 1B:
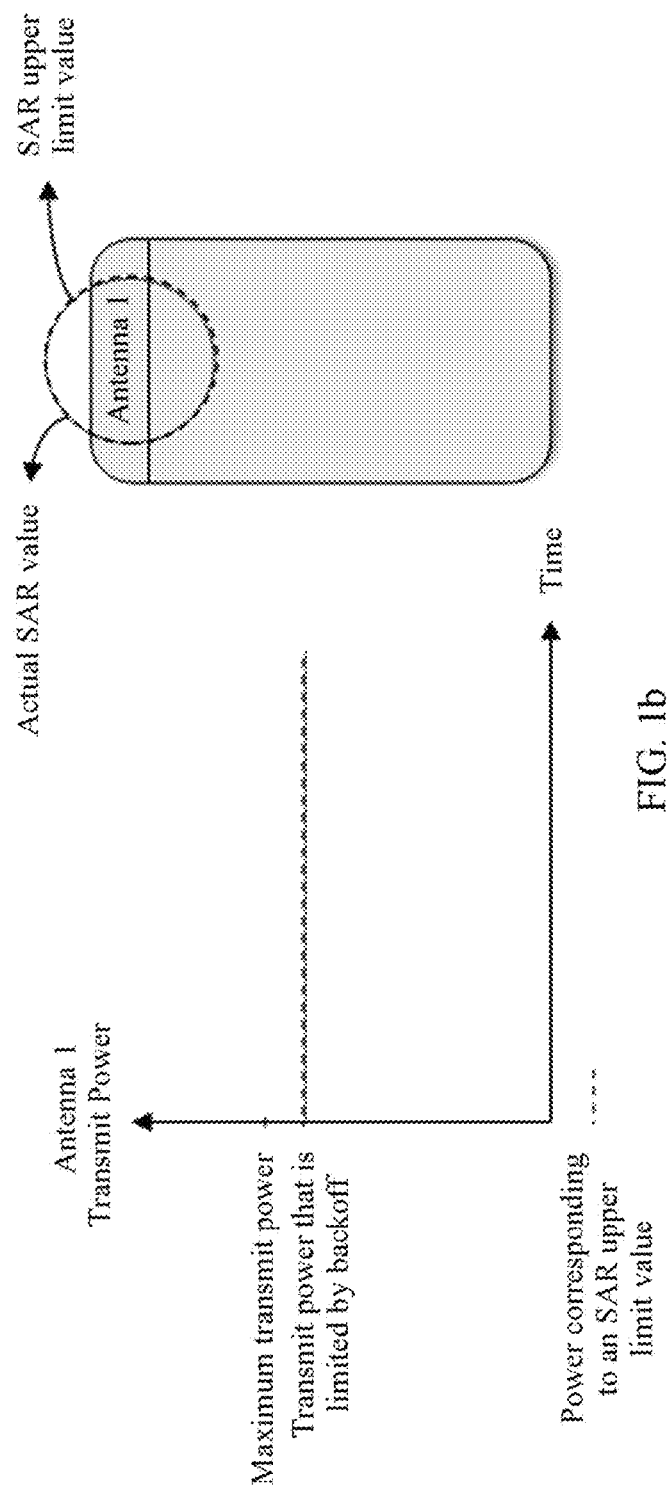
FIG. 1b is a schematic diagram of reducing an SAR value by using a power backoff mechanism.
Figure 1C:
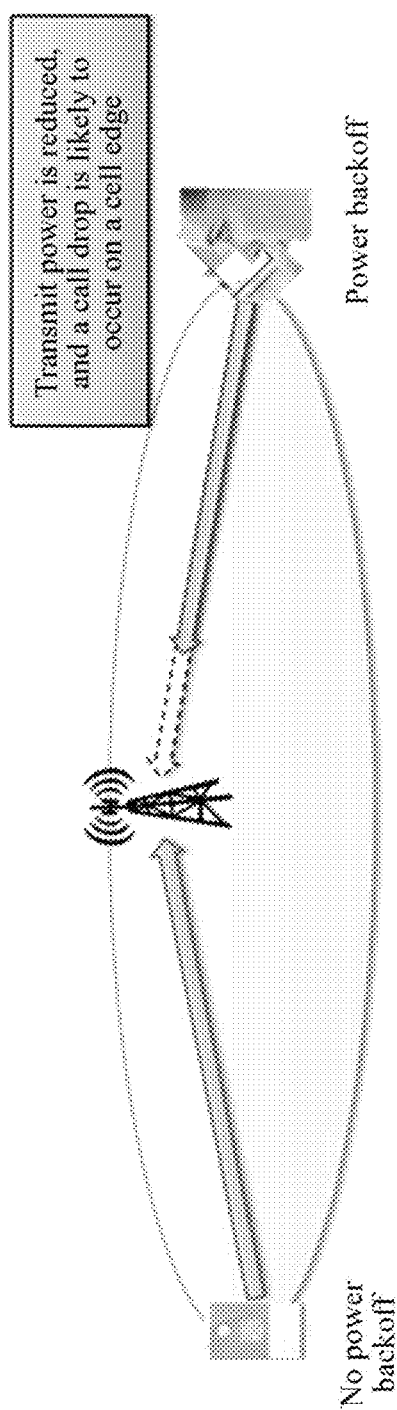
FIG. 1c is a schematic diagram of a scenario in which call performance of a wireless communications device deteriorates after antenna transmit power decreases.
Figure 2A:
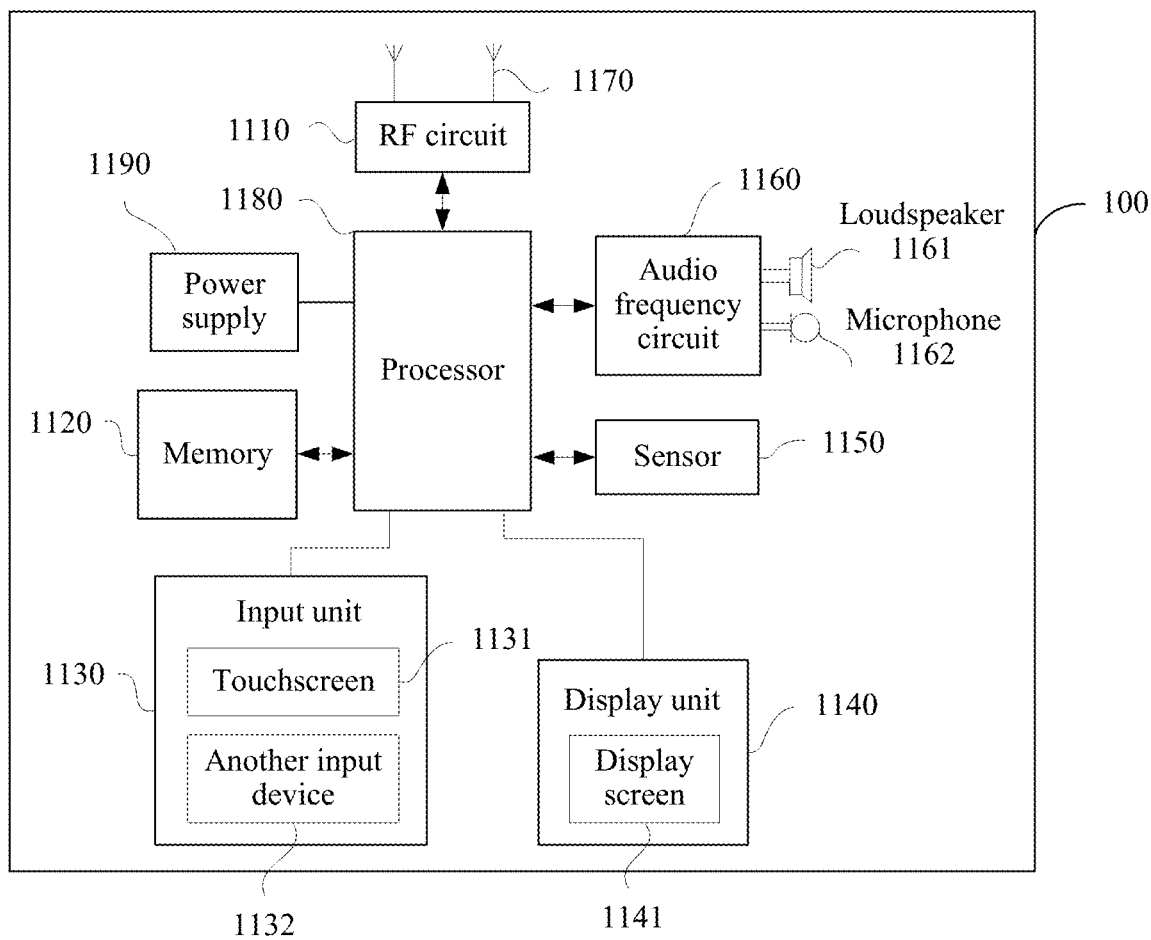
FIG. 2a is a schematic structural diagram of a wireless communications device according to an embodiment of the present invention.

FIG. 2a is a schematic structural diagram of a wireless communications device according to an embodiment of the present invention. A wireless communications device 100 includes components such as a radio frequency (Radio Frequency, RF) circuit 1110, a memory 1120, an input unit 1130, a display unit 1140, a sensor 1150, an audio circuit 1160, an antenna 1170, a processor 1180, and a power supply 1190. These components communicate with each other by using one or more communications buses or signal cables. A person skilled in the art may understand that the device structure shown in FIG. 2a constitutes no limitation on the wireless communications device, and the wireless communications device may include more or fewer components than those shown in the diagram, or may combine some components, or may have different component arrangements.

The following specifically describes each constituent component of the wireless communications device 100 with reference to FIG. 2a:

The RF circuit 1110 may be configured to: in a data transmission process, convert an electrical signal into a radio frequency signal (for example, an electromagnetic signal), and send the radio frequency signal to a wireless communications network or another communications device at specified transmit power by using the antenna (Antenna) 1170. On the contrary, the RF circuit 1110 converts a radio frequency signal received by the antenna 1170 into an electrical signal, and sends the electrical signal to the processor 1180 for processing. For example, when the wireless communications device 100 interacts with a base station, the RF circuit 1110 controls the antenna 1170 to receive a radio frequency signal that is delivered by the base station and that carries downlink data, and transmits the radio frequency signal to the processor 1180 for processing. In addition, the RF circuit 1110 receives a radio frequency signal that is sent by the processor 1180 and that carries uplink data, and sends the radio frequency signal to the base station by using the antenna 1170. The uplink data or the downlink data includes call data, information data, mobile network data, or the like. The wireless communications device 100 includes at least two antennas 1170. It should be noted that a spacing between positions of the two antennas in a mobile phone is greater than a preset spacing. The preset spacing is a measured length of a unit measurement cube on an absorber that simulates human tissue in an SAR test process. Specifically, the spacing between the positions of the two antennas in the mobile phone is a distance between placement positions of the two antennas on a circuit card of the mobile phone, and needs to meet the following condition:

When a radio frequency signal is transmitted by using the two antennas, a distance between hotspot areas of generated radio-frequency radiation energy is greater than the measured length of the unit measurement cube on the absorber during an SAR test, so as to prevent antenna radiation energy from being accumulated in a same SAR measurement area.

For example, if a radius of a hotspot area of an antenna 1 is x, a radius of a hotspot area of an antenna 2 is y, and a measured length of a unit measurement cube on an absorber is z, a distance d between the two antennas may need to meet the following conditions: (1) If $x+y \geq z$, d is greater than $x+y$; (2) If $x+y \leq z$, d is greater than z.

The wireless communications network is, for example, the Internet (also referred to as the World Wide Web (WWW)), an intranet, and/or a wireless network (such as a cellular phone network, a wireless local area network (LAN), and/or a metropolitan area network (MAN)). Any type of a plurality of communications standards, protocols, and technologies may be used for wireless communication, including but not limited to: a Global System for Mobile Communications (GSM), Enhanced Data for GSM Environment (EDGE), High Speed Downlink Packet Access (HSDPA), High Speed Uplink Packet Access (HSUPA), Wideband Code Division Multiple Access (W-CDMA), Code Division Multiple Access (CDMA), Time Division Multiple Access (TDMA), Long Term Evolution (Long Term Evolution, LTE for short), Bluetooth, Wireless Fidelity (WI-Fi) (for example, IEEE 802.11a, IEEE 802.11b, IEEE 802.11g, and/or IEEE 802.11n), Voice over Internet Protocol (VoIP), Wi-MAX, an email protocol (for example, Internet Message Access Protocol (IMAP) and/or Post Office Protocol (POP)), an instant message (for example, Extensible Messaging and Presence Protocol (XMPP), SIP for Instant Messaging and Presence Leveraging Extensions (SIMPLE), an instant message and presence service (IMPS), and/or a short message service (SMS)), or any other appropriate communications protocol, including a communications protocol that has not been developed at the submission date of this specification.

The memory 1120 may be configured to store a software program and a module. By running the software program and the module stored in the memory 1120, the processor 1180 performs various function applications of the wireless communications device and data processing. The memory 1120 may mainly include a program storage area and a data storage area. The program storage area may store an operating system, an application program (such as a sound play function or an image play function) required by at least one function, or the like. The data storage area may store data (such as audio data or a phone book) created according to use of the wireless communications device, or the like. In addition, the memory 1120 may include a high-speed random access memory, and may further include a nonvolatile memory, such as at least one magnetic disk storage device, a flash storage device, or another volatile solid-state storage device.

The input unit 1130 may be configured to: receive entered gesture information and digital or character information, and generate key signal input related to user setting and function control of the wireless communications device 100. Specifically, the input unit 1130 may include a touchscreen 1131 and another input device 1132. The touchscreen 1131 may collect a touch operation (such as an operation performed by a user on the touchscreen 1131 or near the touchscreen 1131 by using any proper object or accessory, such as a finger or a stylus) of the user on or near the touchscreen 1131, and drive a corresponding connected apparatus according to a preset program. The input unit 1130 may include the another input device 1132 in addition to the touchscreen 1131. Specifically, the another input device 1132 may include but is not limited to one or more of a physical keyboard, a function key (such as a volume control key or an on/off key), a trackball, a mouse, a joystick, or the like.

The display unit 1140 may be configured to display information entered by the user or information provided for the user, and various menus of the wireless communications device. The display unit 1140 may include a display screen 1141. Optionally, the display screen 1141 may be configured by using a liquid crystal display (Liquid Crystal Display, LCD), an organic light-emitting diode (Organic Light-Emitting Diode, OLED), or the like. In FIG. 2a, the touchscreen 1131 and the display screen 1141 are used as two independent components to implement input and input functions of the wireless communications device. However, in some embodiments, the touchscreen 1131 and the display screen 1141 may be integrated to implement the input and output functions of the wireless communications device.

The wireless communications device may further include at least one sensor 1150, such as a capacitive sensor, a light sensor, a motion sensor, or another sensor. The light sensor may include an ambient light sensor and a proximity sensor. The proximity sensor may be configured to detect whether an object approaches the wireless communications device. The capacitive sensor may be configured to detect whether an object (for example, a human body or an animal) that can change a capacitance value approaches the wireless communications device.

The audio frequency circuit 1160, a loudspeaker 1161, and a microphone 1162 may provide an audio interface between the user and the wireless communications device. The audio frequency circuit 1160 may convert received audio data into an electrical signal, and transmit the electrical signal to the loudspeaker 1161, and the loudspeaker 1161 converts the electrical signal into a voice signal for output. In addition, the microphone 1162 converts a collected voice signal into an electrical signal, and the audio frequency circuit 1160 receives the electrical signal, converts the electrical signal into audio data, and outputs the audio data to the processor 1180 for processing, so as to send the audio data to, for example, another wireless communications device by using the RF circuit 1110, or output the audio data to the memory 1120 for further processing.

The processor 1180 is a control center of the wireless communications device, connects all parts of the entire wireless communications device by using various interfaces and lines, and performs various functions of the wireless communications device and data processing by running or executing the software program and/or the module stored in the memory 1120 and by invoking data stored in the memory 1120, so as to perform overall monitoring on the wireless communications device. Optionally, the processor 1180 includes an application processor and a modem processor. The application processor mainly processes the operating system, a user screen, the application program, and the like, and the modem processor mainly processes wireless communication. It may be understood that the modem processor and the modem processor may be integrated into one processor, or may be separate processors that are mutually independent. The processor 1180 may be a central processing unit (Central Processing Unit, "CPU" for short), or may be another general purpose processor, a digital signal processor (DSP), an application-specific integrated circuit (ASIC), a field programmable gate array (FPGA), or another programmable logic device, a discrete gate or transistor logic device, a discrete hardware component, or the like. The general purpose processor may be a microprocessor, or the processor may be any conventional processor, or the like.

The wireless communications device further includes the power supply 1190 (such as a battery) that supplies power to all the components. Preferably, the power supply may be logically connected to the processor 1180 by using a power management system, so as to implement functions such as charging and discharging management and power consumption management by using the power management system.

Although not shown, the wireless communications device may further include a WiFi module, a camera, a Bluetooth module, a GPS module, and the like, and details are not described herein.

Figure 2B:
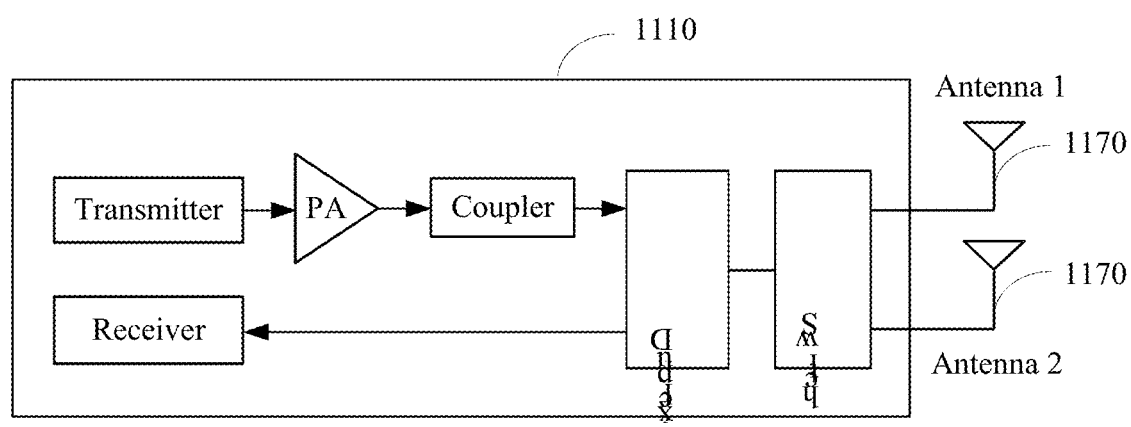

FIG. 2*b* is a schematic structural diagram of the RF circuit 1110 of the wireless communications device in FIG. 2*a*. A person skilled in the art may understand that the circuit structure shown in FIG. 2*b* constitutes no limitation on the RF circuit, and the RF circuit may include more or fewer components than those shown in the diagram, or may combine some components, or may have different component arrangements. As shown in FIG. 2*b*, the RF circuit 1110 includes but is not limited to a transmitter (Transmitter), a receiver (Receiver), at least one power amplifier (Power Amplifier, PA for short), a coupler (Coupler), a duplexer (Duplexer), and a switching switch (Switch). The RF circuit 1110 is electrically connected to the at least two antennas 1170 in FIG. 2*a*. Specifically, the switching switch of the RF circuit 1110 is configured to switch a connection to the antenna (Antenna) 1 or the antenna 2 according to an indication. When the switching switch is connected to the antenna 1, a radio frequency signal is transmitted or received by using the antenna 1. When the switching switch is connected to the antenna 2, a radio frequency signal is transmitted or received by using the antenna 2.

Specifically, after the processor 1180 sends a radio frequency signal to the RF circuit 1110, the transmitter of the RF circuit 1110 transmits the signal to the PA, and the PA performs power amplification on the signal. A radio frequency signal obtained after the power amplification is sent to the antenna 1 or the antenna 2 after being processed by the coupler and the duplexer. Finally, the radio frequency signal is radiated to space by the antenna 1 or the antenna 2 at specified transmit power, and is finally received by a peer receiving device. Higher transmit power of an antenna provides a longer distance for which a radio frequency signal may be transmitted, and results in higher RF radiation generated at the antenna and a larger SAR value of a corresponding wireless communications device. On the contrary, when transmit power of an antenna decreases, a distance for which a radio frequency signal may be transmitted becomes shorter, RF radiation generated at the antenna is reduced, and an SAR value of a corresponding wireless communications device becomes smaller. A maximum value of the transmit power of the antenna is maximum transmit power of the antenna. In a process of transmitting the radio frequency signal by using the antenna, the transmit power of the antenna is less than or equal to the maximum transmit power of the antenna.

As described above, RF radiation energy that is absorbed by a human body from the wireless communications device depends on a value of electric intensity caused when the wireless communications device receives or sends a radio frequency signal. However, the electric intensity is attenuated with an increase in distance. That is, when a radio frequency signal is received or sent by using an antenna of the wireless communications device, electric intensity at a place closer to the antenna increases, and electric intensity at a place farther from the antenna gradually decreases. Therefore, when the radio frequency signal is transmitted by using the antenna of the wireless communications device at same transmit power, more RF radiation energy may be absorbed by the human body from the wireless communications device when the human body is close to the wireless communications device, and less RF radiation energy is absorbed by the human body when the human body is far away from the wireless communications device. Therefore, in SAR standards specified by the US FCC and the European CE, when the SAR value of the wireless communications device is tested, a distance between the wireless communications device and the human body needs to be less than a detection distance specified for the SAR test.

In addition, most wireless communications devices are in a cuboid-like shape, and need to occupy specified cubical space (as a screen size of the wireless communications device is enlarged, cubical space occupied by the wireless communications device correspondingly becomes larger). Therefore, when the wireless communications device is near the human body, distances between the human body and different areas of the wireless communications device are different. Some areas are relatively close to the human body, and some areas are relatively far away from the human body. Therefore, in the SAR standard, an SAR value test method is as follows: An area of the wireless communications device is placed within a detection distance from the human body, and RF radiation energy in the area of the wireless communications device in a period of test time is detected. For different areas of the wireless communications device, the detection distance may vary.

Figure 3A:
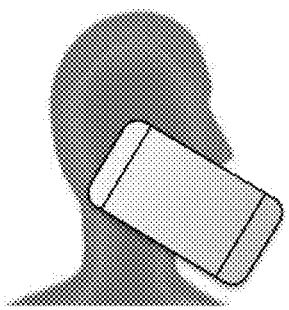
FIG. 3a is a schematic diagram of an application scenario in which a mobile phone is close to a head of a human body.
Figure 3B:
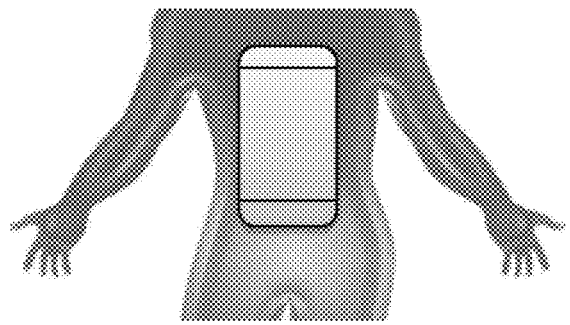
FIG. 3b is a schematic diagram of an application scenario in which a mobile phone is close to a human body.

The following separately describes, by using an example in which a top of a mobile phone and a front of the mobile phone are close to an absorber, a process of testing an SAR value of the mobile phone in an SAR standard specified by the US FCC. The mobile phone includes two antennas, and positions of the two antennas are separately close to the top of the mobile phone and a bottom of the mobile phone. That the top of the mobile phone is close to the absorber is used to simulate a scenario in which the mobile phone is close to a head of a human body, and this is referred to as a head SAR test. FIG. 3*a* is a schematic diagram of an application scenario in which a mobile phone is close to a head of a human body. That the front of the mobile phone is close to the absorber is used to simulate a scenario in which the whole mobile phone is close to the human body, and this is referred to as a body SAR test. FIG. 3b is a schematic diagram of an application scenario in which a mobile phone is close to a human body.

An absorber (for example, a phantom) that simulates human tissue is first disposed. All areas (for example, a front, a back, a top, and a bottom) of a wireless communications device separately approach the absorber. After the wireless communications device continuously transmits a radio frequency signal for a period of time, a 1-gram (g) cube that is close to a detected area of the wireless communications device is extracted from the absorber, and an SAR value of the cube is detected. If the SAR value is less than or equal to 1.6 W/kg, the wireless communications device conforms to the SAR standard in the US FCC. An SAR test process in the European CE is similar to that in the US FCC, and a difference is that the European CE specifies that during an SAR test, a 10-gram cube needs to be extracted from an absorber for detection. It should be noted that a spacing between positions of an antenna at the top of the mobile phone and an antenna at the bottom of the mobile phone is greater than a preset spacing. The preset spacing is a measured length of a unit measurement cube on the absorber. For example, during an SAR value test in the US FCC, the unit measurement cube on the absorber is a 1 g cube, and during an SAR value test in the European CE, the unit measurement cube on the absorber is a 10 g cube. The measured length of the unit measurement cube is a side length of a surface that is of the cube and that faces the mobile phone. If a length of the surface that is of the unit measurement cube and that faces the mobile phone is different from a width thereof, a value of the preset spacing is a maximum value of the length or the width of the surface that is of the unit measurement cube and that faces the mobile phone.

In the head SAR test, a detection distance between the top of the mobile phone and the absorber is five millimeters, the mobile phone continuously transmits a radio frequency signal by using the antenna at the top, and RF radiation energy separately absorbed by one or more 1 g cubes that are on the absorber and that are close to the top of the mobile phone is detected. If RF radiation energy absorbed by any 1 g cube exceeds a limit, the SAR value of the mobile phone exceeds a limit.

In the body SAR test, a detection distance between the front of the mobile phone and the absorber is seven millimeters, the mobile phone continuously transmits a radio frequency signal by using the antenna at the top, a plurality of 1 g cubes that are close to the front of the mobile phone are extracted from the absorber, and RF radiation energy absorbed by each cube is detected. Therefore, at least one 1 g cube close to a top of the front of the mobile phone needs to be extracted, and at least one 1 g cube close to a bottom of the front of the mobile phone needs to be extracted. If RF radiation energy absorbed by any 1 g cube exceeds a limit, the SAR value of the mobile phone exceeds a limit. Because transmission is continuously performed by using the antenna at the top of the mobile phone, and no radio frequency signal is transmitted by using the antenna at the bottom, RF radiation energy absorbed by a 1 g cube close to the top of the front of the mobile phone is greater than RF radiation energy absorbed by a 1 g cube close to the bottom of the front of the mobile phone.

Further, RF radiation energy absorbed by the human body or the absorber is accumulated over time. Therefore, in all SAR value tests, a value of RF radiation energy that is accumulated in an area of the wireless communications device is detected in a specified test time period. When accumulation of the RF radiation energy stops, the RF radiation energy absorbed by the human body or the absorber is released over time.

Based on the foregoing reason, a technical solution for controlling an SAR of a wireless communications device is provided. The wireless communications device includes at least two antennas, that is, a first antenna and a second antenna, and a distance between positions of the first antenna and the second antenna in the wireless communications device is greater than a preset spacing. Specifically, the preset spacing is a measured length of a unit measurement cube on an absorber during an SAR value test.

The wireless communications device transmits a radio frequency signal by using the first antenna at specified transmit power. When transmit power of the first antenna exceeds transmit power that is of the antenna and that is corresponding to an SAR upper limit value specified in an SAR standard, the radio frequency signal continues being transmitted by using the first antenna if the transmit power of the first antenna does not back off. When an SAR value at the first antenna is to exceed a limit, the radio frequency signal stops being transmitted by using the first antenna, and the first antenna is switched to the second antenna to transmit the radio frequency signal.

Because RF radiation energy needs to be accumulated for a specified time, when transmit power of an antenna is relatively high, an SAR value of the wireless communications device does not exceed a limit instantaneously. Therefore, before the SAR value of the wireless communications device exceeds a limit, the radio frequency signal stops being transmitted by using the antenna, and RF radiation energy that is accumulated at the antenna stops increasing, and is gradually reduced and released over time, so as to prevent the SAR value of the wireless communications device from exceeding a limit. In addition, because there is no backoff of antenna transmit power, communication performance of the wireless communications device is improved in comparison with a power backoff technical solution.

Specifically, after the transmit power of the first antenna exceeds the transmit power that is of the antenna and that is corresponding to the SAR upper limit value specified in the SAR standard, duration of continuous transmission by using the first antenna needs to be less than test duration that is of an SAR test and that is specified in the SAR standard.

Before the test duration of the SAR test elapses, the radio frequency signal stops being transmitted by using the first antenna. Therefore, the SAR value at the first antenna is reduced in the entire test duration.

Specifically, after the transmit power of the first antenna exceeds the transmit power that is of the antenna and that is corresponding to the SAR upper limit value specified in the SAR standard, the duration of continuous transmission by using the first antenna needs to meet: when the radio frequency signal is transmitted at maximum transmit power of the first antenna, the SAR value at the first antenna is equal to or less than the SAR upper limit value specified in the SAR standard.

Therefore, regardless of how much the transmit power of the first antenna is greater than the transmit power that is corresponding to the SAR upper limit value specified in the SAR standard, the duration of continuous transmission by using the first antenna does not cause that the SAR value of the wireless communications device exceeds a limit.

Specifically, the duration of continuous transmission by using the first antenna may be obtained through testing in a laboratory SAR value test method. For example, when the radio frequency signal is transmitted by using the first antenna of the wireless communications device at the maximum transmit power, and a detected SAR value of the wireless communications device reaches the upper limit value in the SAR standard, duration in which transmission is performed by using the first antenna is the duration of continuous transmission by using the first antenna.

Figure 4:
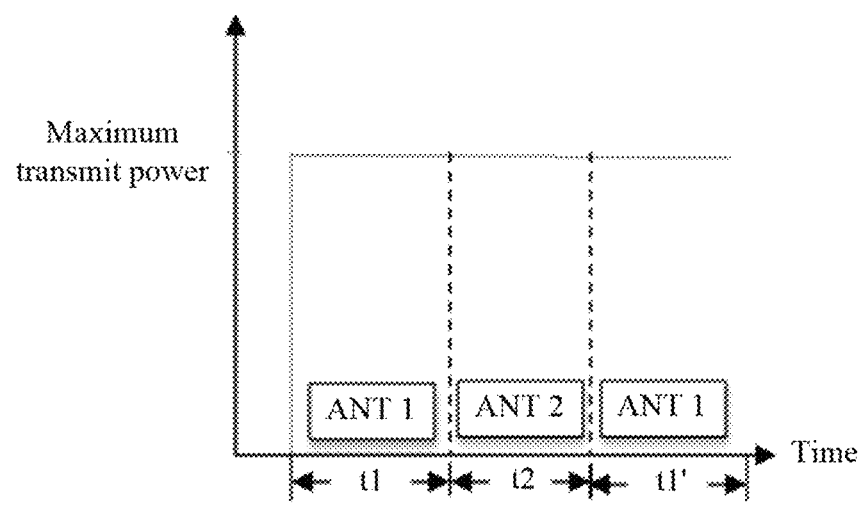
FIG. 4 is a time sequence diagram of antenna transmit power of a wireless communications device in a test time.

FIG. 4 is a time sequence diagram of antenna transmit power of a wireless communications device in a test time. As shown in FIG. 4, antenna switching is performed twice in the test time. Transmission times of a first antenna are t1 and t1', and duration in which a radio frequency signal is transmitted by using a second antenna is t2. Because a transmission time of each antenna is less than a total length of the test time, RF radiation energy that is accumulated at each antenna in the total test time is reduced, and an SAR value at each antenna does not exceed a limit. Therefore, the wireless communications device meets a requirement for detecting an SAR value. For example, in a six-minute test time, if RF radiation energy generated at each antenna does not exceed a limit, antenna switching may be performed once, or may be performed a plurality of times. Because no power backoff is performed on the wireless communications device, communication quality of the wireless communications device is ensured.

Figure 4A:
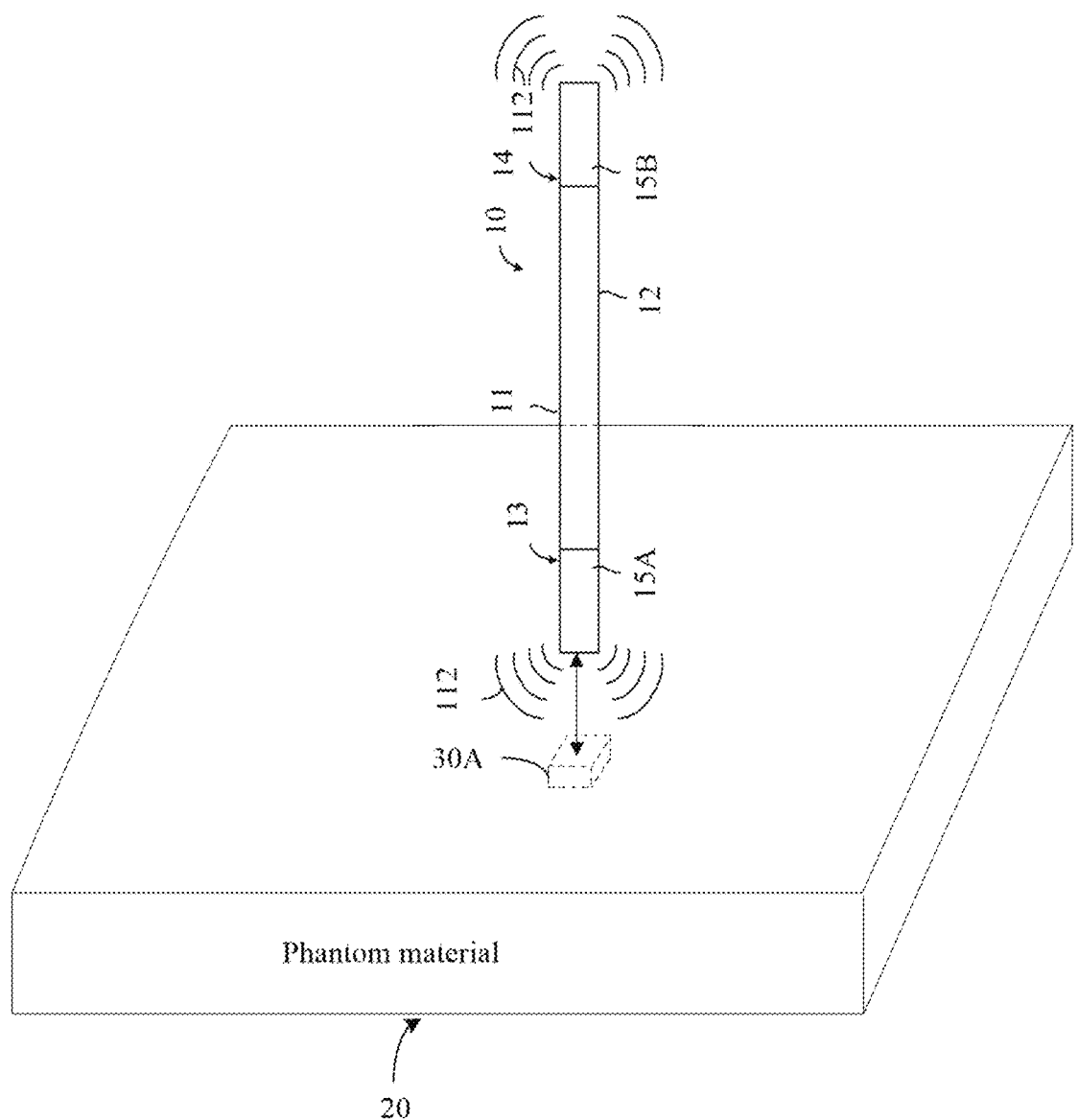
FIG. 4a is a schematic diagram of testing an SAR value at a top of a mobile phone during FCC authentication.
Figure 4B:
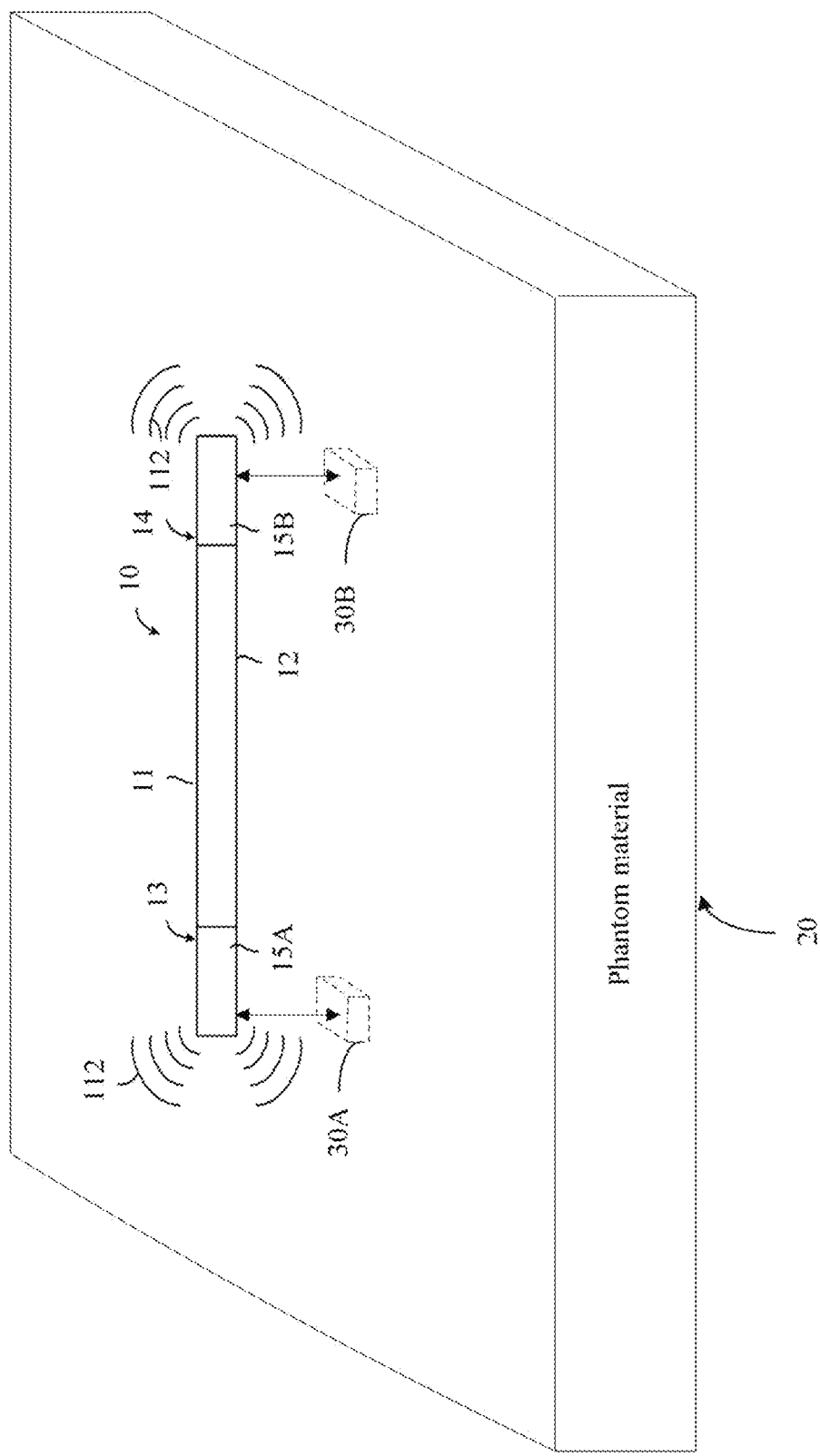
FIG. 4b is a schematic diagram of testing an SAR value at a front of a mobile phone during FCC authentication.

By using a mobile phone as an example, the following describes the foregoing technical solution of reducing an SAR value of a wireless communications device. FIG. 4a is a schematic diagram of testing an SAR value at a top of a mobile phone during FCC authentication. FIG. 4b is a schematic diagram of testing an SAR value at a front of a mobile phone during FCC authentication. In FIG. 4a and FIG. 4b, a mobile phone 10 and an absorber 20 that simulates human tissue are included. The mobile phone 10 includes a back 11 of the mobile phone, a front 12 of the mobile phone, a top 13 of the mobile phone, and a bottom 14 of the mobile phone. Two antennas 15A and 15B of the mobile phone are respectively disposed at the top 13 and the bottom 14 of the mobile phone. A distance between positions of the antenna 15A at the top 13 of the mobile phone and the antenna 15B at the bottom 14 of the mobile phone is greater than a measured length of a 1 g cube on the absorber. A test time of the SAR value is 6 minutes.

As shown in FIG. 4a, when an SAR value at the top 13 of the mobile phone is tested, the top 13 of the mobile phone is placed within a detection distance of the absorber 20. It may be learned that because of a size of the mobile phone 10, a distance between another area (for example, the bottom 14) of the mobile phone 10 and the absorber is greater than the detection distance (as shown in FIG. 3a, a bottom of a mobile phone is far away from a human body during the head SAR test). If the mobile phone always transmits a radio frequency signal by using the antenna 15A at the top at maximum transmit power, a value of RF radiation energy absorbed, in six minutes, by a 1 g cube (a dashed-line box 30A shown in the diagram) that is on the absorber and that is close to the top of the mobile phone is X W. If X W is greater than RF radiation energy corresponding to an SAR upper limit value in a compliance standard, the mobile phone 10 exceeds a limit. However, if antenna switching is performed by using the RF circuit 1110 of the wireless communications device shown in FIG. 2b, the mobile phone transmits, only in first three minutes, the radio frequency signal by using the antenna 15A at the top at the maximum transmit power, and switches an antenna that is of the mobile phone and that is used to transmit the radio frequency signal to the antenna 15B at the bottom 14 of the mobile phone at a fourth minute and one second. Because the bottom 14 of the mobile phone is far away from the absorber 20, a value of RF radiation energy absorbed by the absorber from the top 13 of the mobile phone in one minute is X/2 W, and an SAR value that may be detected at the top 13 of the mobile phone is effectively reduced. It should be noted that after antenna switching is performed by using the RF circuit 1110, when the mobile phone transmits the radio frequency signal by using the antenna 15B at the bottom 14, transmit power of the antenna 15B at the bottom may be maximum transmit power, or may be less than maximum transmit power. The antenna 15B at the bottom is far away from the absorber. Therefore, even if transmission is performed by using the antenna 15B at the bottom at the maximum transmit power, an SAR value of the mobile phone 10 does not exceed a limit in an SAR detection process. Because no power backoff is performed on an antenna before and after the antenna switching, communication performance of the wireless communications device is ensured.

When an SAR value at the front 12 of the mobile phone is tested, the front 12 of the mobile phone is placed within a detection distance of the absorber 20 (as shown in FIG. 3b, both a top and a bottom of a mobile phone are relatively close to a human body during the body SAR test). If the mobile phone 10 always transmits a radio frequency signal by using the antenna 15A at the top at maximum transmit power, RF radiation energy absorbed by the absorber 20 from the front 12 of the mobile phone in six minutes is concentrated on the top of the mobile phone. That is, a value of RF radiation energy absorbed by a 1 g cube (a dashed-line box 30A shown in the diagram) that is on the absorber 20 and that is close to the top of the mobile phone is Y W. If Y W is greater than RF radiation energy corresponding to an SAR upper limit value in a compliance standard, the mobile phone 10 exceeds a limit. However, if antenna switching is performed by using the RF circuit 1110 of the wireless communications device shown in FIG. 2b, the mobile phone 10 transmits, in first three minutes, the radio frequency signal by using the antenna 15A at the top at the maximum transmit power, and transmits, in next three minutes, the radio frequency signal by using the antenna 15B at the bottom of the mobile phone at maximum transmit power. Although transmission is performed by using the two antennas both at the maximum transmit power, in six minutes, RF radiation energy is offloaded to two areas: the top and the bottom of the mobile phone. The two areas are separately corresponding to the 1 g cube (the dashed-line box 30A shown in the diagram) that is on the absorber and that is close to the top of the mobile phone and a 1 g cube (a dashed-line box 30B shown in the diagram) that is on the absorber and that is close to the bottom of the mobile phone. RF radiation energy absorbed by each cube is Y/2 W, and a result of detecting each cube does not exceed a limit. Therefore, the SAR value at the front 12 of the mobile phone does not exceed a limit. Because no power backoff is performed on an antenna before and after the antenna switching, communication performance of the wireless communications device is ensured.

In different application scenarios, different antenna switching conditions are set. The foregoing technical solution of reducing an SAR value of a wireless communications device includes a plurality of implementations, and the implementations are separately described below.

A method in the following embodiments is applied to a wireless communications device, and the wireless communications device includes a first antenna and a second antenna. It should be noted that when a specific embodiment is described, "first" and "second" are merely used to distinguish between described objects, and constitutes no limitation on the described objects.

Before the following plurality of embodiments are described, for a brief description, nouns that may be used in the following plurality of embodiments are collectively described herein:

"First preset power": The first preset power is equal to or less than antenna transmit power that is of the first antenna and that is corresponding to an SAR upper limit value specified in an SAR standard. When transmission is performed by using the first antenna at power greater than the first preset power, an SAR value at the first antenna of the wireless communications device may exceed a limit.

That the SAR upper limit value is corresponding to the antenna transmit power of the first antenna means that when a radio frequency signal is always received or sent by using the first antenna at the transmit power, an SAR value of the wireless communications device is equal to the SAR upper limit value specified in the SAR standard. For example, an SAR upper limit value that is of the wireless communications device and that is specified in the US FCC regulation is 1.6 W/kg. In a test time, if transmit power of an antenna is always less than or equal to 21 dBm, an SAR value in an area that is of the wireless communications device and that is close to the antenna does not exceed a limit in a test. In a test time, if transmit power of an antenna is always greater than 21 dBm, an SAR value in an area that is of the wireless communications device and that is close to the antenna exceeds a limit in a test. Therefore, antenna transmit power corresponding to 1.6 W/kg is 21 dBm, and a value of the first preset power is less than or equal to 21 dBm.

"Second preset power": The second preset power and the first preset power have a same meaning, that is, the second preset power is equal to or less than antenna transmit power that is of the second antenna and that is corresponding to an SAR upper limit value specified in the SAR standard. A value of the second preset power may be the same as a value of the first preset power, or may be different from a value of the first preset power. This is not limited in this application.

A position disposed in the wireless communications device, an antenna shape, and an antenna shielding design all affect a value of an SAR value that may be detected when a radio frequency signal is transmitted by using each antenna. Therefore, transmit power that is of different antennas and that is corresponding to a same SAR value may be different.

"First time period": A start moment of the first time period is a moment when the transmit power of the first antenna is greater than the first preset power. When the first time period elapses, the wireless communications device stops using the first antenna and starts transmitting the radio frequency signal by using the second antenna.

Specifically, a length of the first time period is less than test duration that is of an SAR test and that is specified in the SAR standard. When the transmit power of the first antenna is greater than the first preset power, transmission continues being continuously performed in the first time period by using the first antenna at transmit power greater than the first preset power, and the SAR value of the wireless communications device does not exceed a limit. The first time period may be preset in the wireless communications device. When the transmit power of the first antenna varies, a value of the length of the first time period may vary. For example, when the transmit power of the first antenna is 22 dBm (which is greater than the first preset power 21 dBm), a corresponding value of the length of the first time period is 40 seconds. When the transmit power of the first antenna is 23 dBm (which is greater than the first preset power 21 dBm), a corresponding value of the length of the first time period is 30 seconds. A mapping relationship between the transmit power of the first antenna and the length of the first time period may be prestored in the wireless communications device in a form of a mapping table.

"Second time period": A start moment of the second time period is a moment of starting transmitting the radio frequency signal by using the second antenna. When the second time period elapses, the radio frequency signal stops being transmitted by using the second antenna, and the radio frequency signal starts being transmitted by using another antenna. The another antenna may be the first antenna, or may be an antenna other than the first antenna and the second antenna in the wireless communications device.

"First detection distance": The first detection distance is equal to or less than a distance that is between the wireless communications device and a human body and that is specified in the SAR standard. In the SAR standard, if a plurality of different detection distances are separately specified for different areas of the wireless communications device, the first detection distance may be less than or equal to a maximum detection distance in the plurality of different detection distances, or may be less than or equal to a detection distance corresponding to an area that is of the wireless communications device and in which the first antenna is located.

For example, an SAR value that is of the wireless communications device and that is specified in the SAR standard during US FCC authentication is 1.6 W/kg. When a front of a mobile phone is close to the human body, a detection distance between the front of the mobile phone and the human body is seven millimeters.

"Second detection distance": The second detection distance and the first detection distance have a same meaning. A value of the second detection distance may be the same as a value of the first detection distance, or may be different from a value of the first preset power. This is not limited in this application.

"Safety antenna": The safety antenna means that when the radio frequency signal is transmitted by using the safety antenna, the SAR value of the wireless communications device does not exceed a limit. The safety antenna includes two cases: 1. Transmit power of the antenna is less than antenna transmit power that is of the antenna and that is corresponding to an SAR upper limit value specified in the SAR standard. 2. Transmit power of the antenna is greater than antenna transmit power that is of the antenna and that is corresponding to the SAR upper limit value specified in the SAR standard, and a distance between the antenna and the human body is greater than a detection distance. "First preset energy": The first preset energy is less than radio-frequency radiation energy that is at the first antenna and that is corresponding to an SAR upper limit value specified in the SAR standard. Optionally, the first preset energy may be prestored in the wireless communications device. Second preset energy and the first preset energy have a same meaning. A value of the second preset energy may be the same as a value of the first preset energy, or may be different from a value of the first preset energy. This is not limited in this application.

It should be noted that the wireless communications device usually controls transmit power of an antenna by using a baseband chip. Both the following two types of baseband chips may be applied to a wireless communications device that uses the foregoing technical solution. A first type of baseband chip instructs to always transmit the radio frequency signal by using the antenna at maximum power, and the transmit power of the antenna is constant in a data transmission process. A second type of baseband chip has a power control function. That is, to control power consumption, the baseband chip controls to transmit the radio frequency signal by using the antenna at changing power, and the transmit power of the antenna is not constant in a data transmission process.

Embodiment 1

Figure 5A:
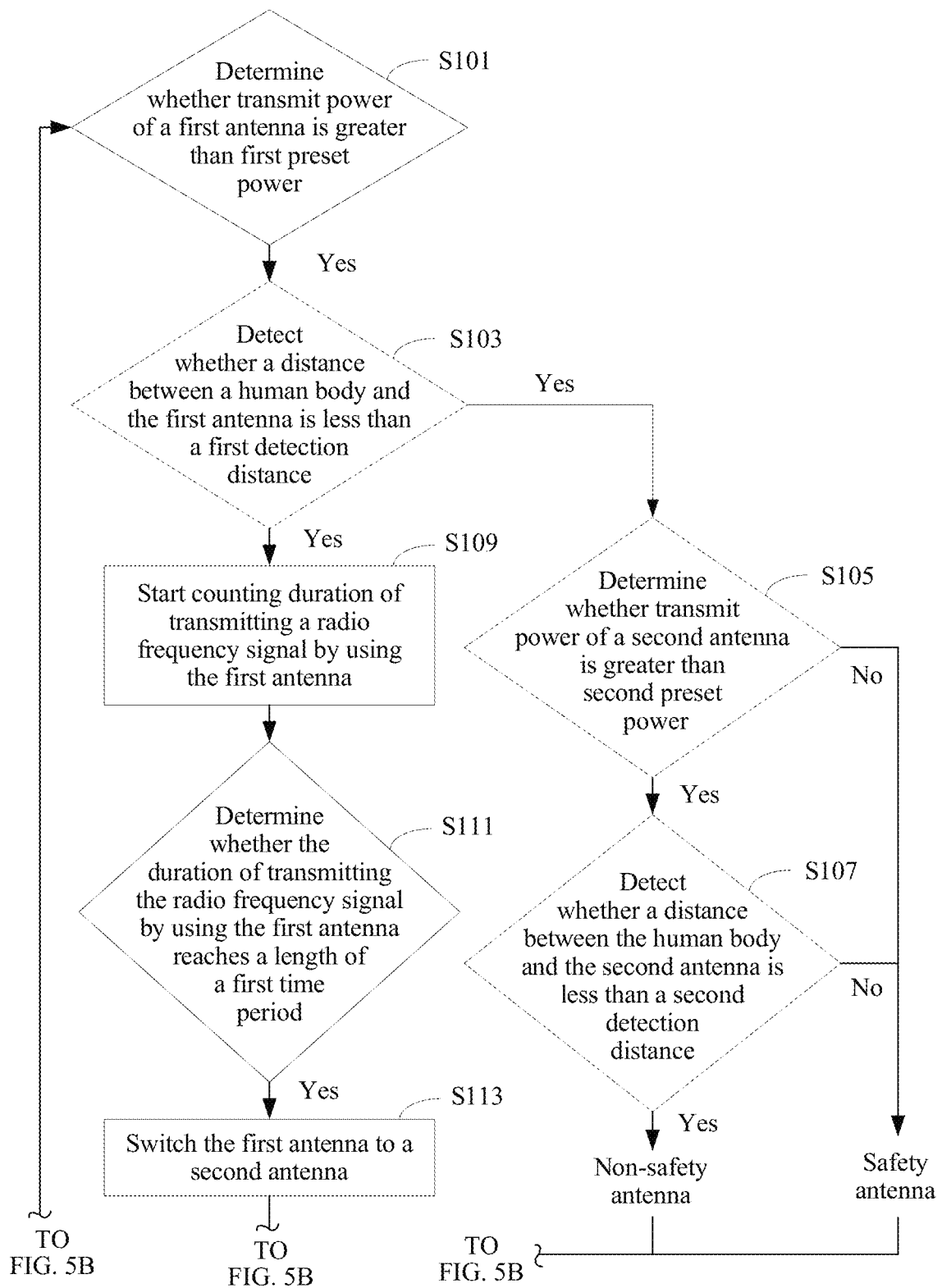
FIG. 5A and FIG. 5B are a schematic flowchart of a first embodiment of a method for controlling an SAR of a wireless communications device according to the present invention.
Figure 5B:
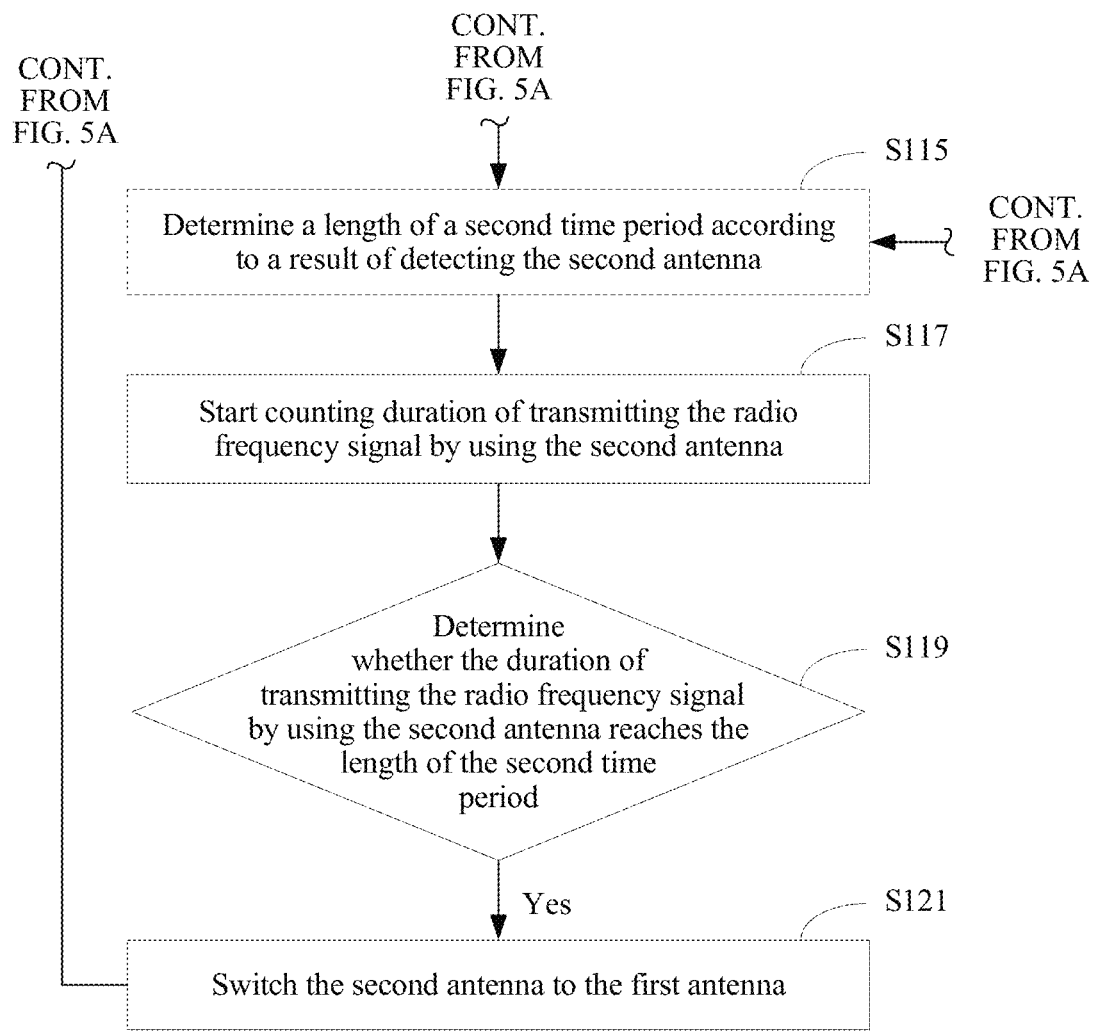
Figure 5A:
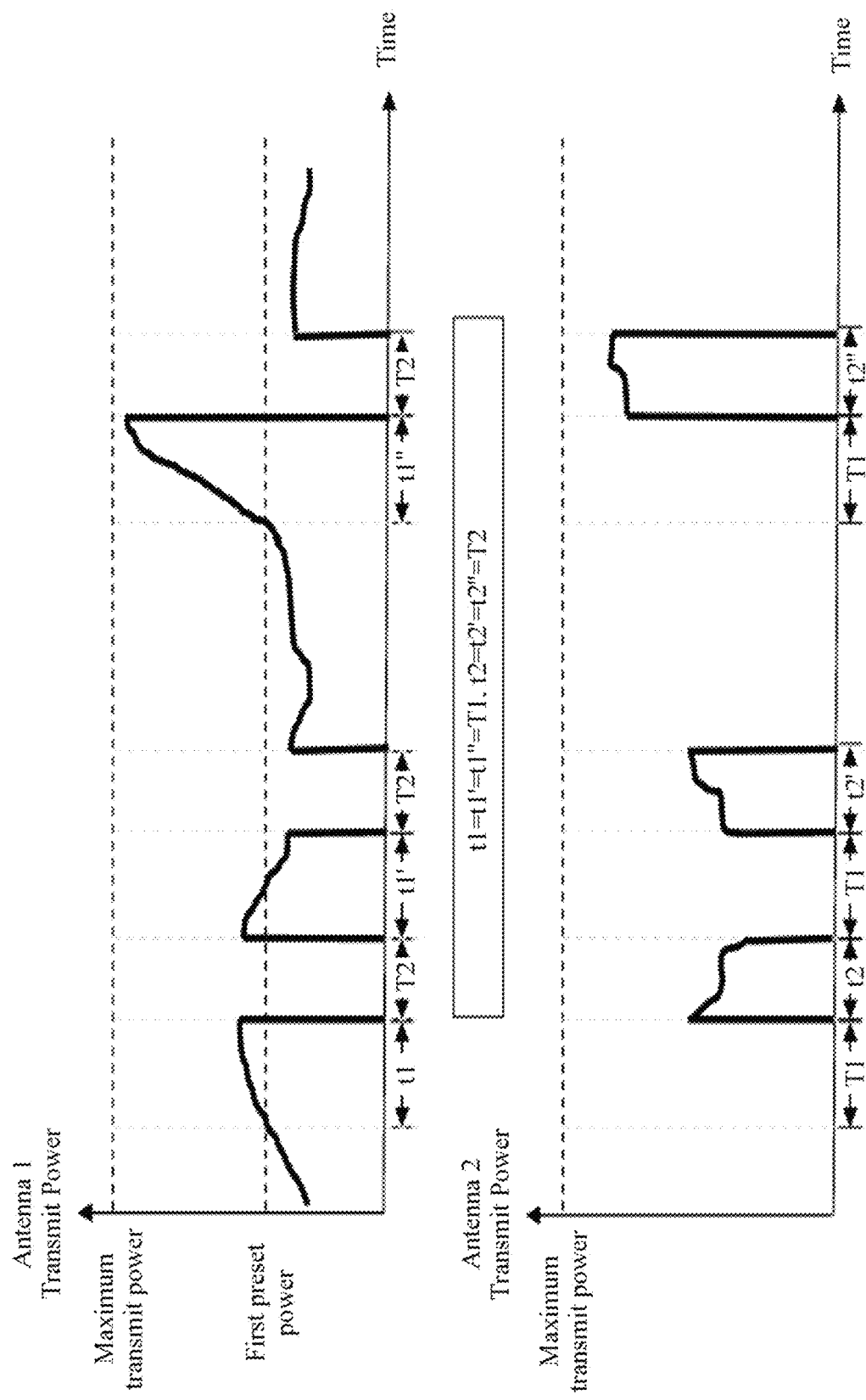
Figure 5B:
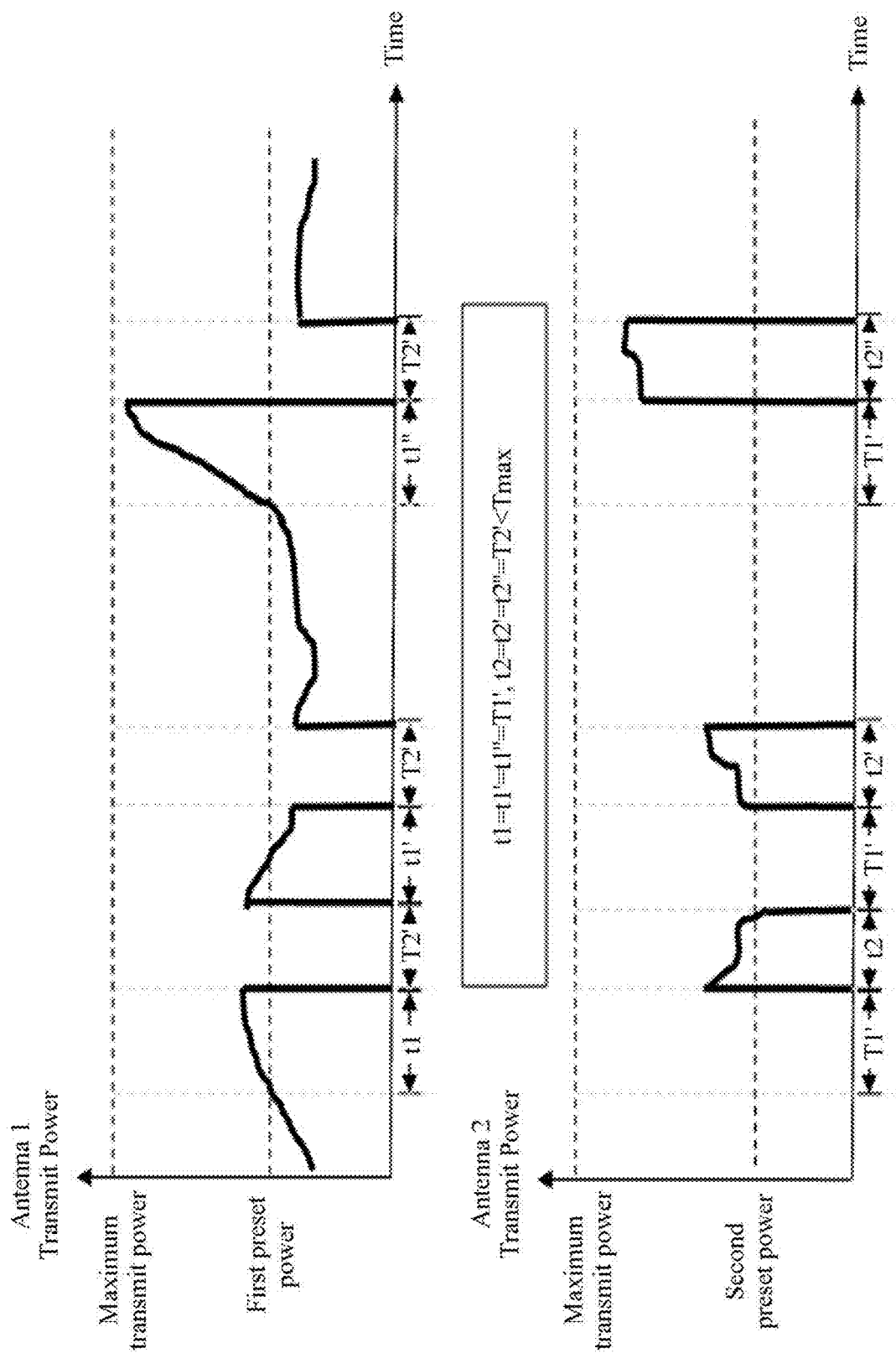

FIG. 5A and FIG. 5B are a schematic flowchart of a first embodiment of a method for controlling an SAR of a wireless communications device according to the present invention. In Embodiment 1, the wireless communications device further includes a detection module that can detect whether a human body or an absorber that simulates human tissue (which is collectively referred to as "human body" below for ease of description) is close to the wireless communications device. Specifically, the detection module may be a proximity sensor, a capacitive sensor, an infrared sensor, or the like. Optionally, the detection module is separately located near a first antenna and a second antenna. As shown in FIG. 5, a method 1000 includes the following steps.

Step S101: Monitor transmit power of a first antenna, and determine whether the transmit power of the first antenna is greater than first preset power, and if the transmit power of the first antenna is greater than the first preset power, continue transmitting a radio frequency signal by using the first antenna, and perform step S103; if the transmit power of the first antenna is less than the first preset power, end the method 1000.

When transmitting the radio frequency signal by using the first antenna, the wireless communications device generates RF radiation. Because RF radiation energy positively correlates with transmit power of an antenna, it may be determined, according to a value of the transmit power of the antenna, whether an SAR of the wireless communications device exceeds a limit when the radio frequency signal is transmitted by using the antenna.

Step S103: Detect a distance between a human body and the first antenna, and determine whether the distance between the human body and the first antenna is less than a first detection distance.

If the distance between the human body and the first antenna is greater than the first detection distance or the wireless communications device fails to find the human body, no radiation damage is caused to the human body even if the transmit power of the first antenna is greater than the preset power, and SAR reduction processing does not need to be performed on the wireless communications device. In this case, the method 1000 ends. When it is detected that the transmit power of the first antenna is greater than the first preset power, and the distance between the human body and the first antenna is less than the first detection distance, it indicates that an area that is of the wireless communications device and that is close to an antenna is relatively close to the human body, a value of RF radiation energy absorbed by the human body may not meet an SAR standard, and step S109 and step S105 are performed.

A sequence of performing steps S101 and S103 is not limited, and step S103 may be performed before step S101. A specific distance detection method may be as follows: The detection module detects a distance between the human body and the detection module. Because an antenna placement position in the wireless communications device is fixed, the distance between the human body and the first antenna may be determined according to the distance between the human body and the detection module. For example, the capacitive sensor is disposed at a top of a mobile phone. When the human body is close to the top of the mobile phone, a capacitance value of the capacitive sensor changes, and it is determined, according to a variable of the capacitance value, whether the distance between the human body and the first antenna is less than the first detection distance. There are a plurality of specific distance detection methods, and this is not limited in this application.

Step S105: Detect transmit power of a second antenna, and determine whether the transmit power of the second antenna is greater than second preset power.

When the transmit power of the second antenna is less than the second preset power, the second antenna is a safety antenna, and step S115 is performed. When the transmit power of the second antenna is greater than the second preset power, step S107 is performed.

Step S107: Detect whether a distance between the human body and the second antenna is less than a second detection distance.

Specifically, a method for detecting the distance between the human body and the second antenna is similar to that in step S103, and details are not described herein again. If the distance between the human body and the second antenna is greater than the second detection distance, it is also considered that the second antenna is a safety antenna, and step S117a is performed. That is, although the transmit power of the second antenna is relatively high, because the second antenna is relatively far away from the human body, no RF radiation that exceeds the SAR standard is caused to the human body. If the transmit power of the second antenna is greater than the second preset power, and the distance between the human body and the second antenna is less than the second detection distance, it is considered that the second antenna is a non-safety antenna, and step S115 is performed. A sequence of performing steps S105 and S107 is not limited, and step S107 may be performed before step S105.

Optionally, the detection module may be omitted in the wireless communications device. That is, step S103 and/or step S107 may be omitted. When step S103 is omitted, if the transmit power of the first antenna is greater than the first preset power, the first antenna may cause that an SAR value of the wireless communications device exceeds a limit. When step S107 is omitted, if the transmit power of the second antenna is greater than the second preset power, the second antenna is a non-safety antenna.

Optionally, step S105 and step S107 may be omitted. When step S105 and step S107 are omitted, it is considered by default that the second antenna is a non-safety antenna.

Step S109: Start counting duration of transmitting the radio frequency signal by using the first antenna.

Step S111: Determine whether the duration of transmitting the radio frequency signal by using the first antenna reaches a length of a first time period, and if the duration of transmitting the radio frequency signal by using the first antenna reaches the length of the first time period, perform step S113, or if the duration of transmitting the radio frequency signal by using the first antenna does not reach the length of the first time period, continue transmitting the radio frequency signal by using the first antenna until the duration of the transmitting the radio frequency signal by using the first antenna reaches the length of the first time period. The length of the first time period may be preset in the wireless communications device.

Step S113: Switch, from the first antenna to the second antenna, an antenna that is of the wireless communications device and that is used to transmit the radio frequency signal.

When the duration of transmitting the radio frequency signal by using the first antenna reaches the length of the first time period, use of the first antenna stops and the radio frequency signal starts being transmitted by using the second antenna.

Step S115: Determine a length of a second time period according to a result of detecting the second antenna.

Specifically, when the second antenna is a safety antenna, the radio frequency signal may be always transmitted by using the second antenna, and the SAR value of the wireless communications device does not exceed a limit. Further, communication performance of the first antenna is usually better than communication performance of the second antenna (for example, the first antenna is a full-band antenna, and the second antenna is a narrow-band antenna). Therefore, even if the second antenna is a safety antenna, to ensure optimal communication performance of the wireless communications device, after RF radiation energy that is accumulated at the first antenna is reduced, the wireless communications device may switch the second antenna back to the first antenna to transmit the radio frequency signal.

When the second antenna is a non-safety antenna, the length of the second time period needs to be less than a test time of an SAR test. When the second antenna is a non-safety antenna, the SAR value of the wireless communications device also exceeds a limit if the second antenna is always used. Therefore, duration of transmitting the radio frequency signal by using the second antenna cannot be greater than the test time, and the second antenna needs to be switched back to the first antenna after being used for transmission for a period of time, so as to reduce RF radiation energy that is accumulated at the second antenna. Although neither the first antenna nor the second antenna is a safety antenna, because RF radiation energy that is accumulated at both the two antennas is relatively low, the SAR value of the whole wireless communications device does not exceed a limit.

Optionally, the length of the second time period may be preset in the wireless communications device. A plurality of values may be set for the length of the second time period according to different transmit power of the second antenna.

Optionally, a value of the length of the second time period is a time length required for reducing the RF radiation energy that is accumulated at the first antenna to zero.

Optionally, the length of the second time period is equal to the length of the first time period.

When step S105 and step S107 are omitted, it is considered by default that the second antenna is a non-safety antenna. Step S115 is correspondingly omitted.

Step S117: Start counting duration of transmitting the radio frequency signal by using the second antenna.

Step S119: Determine whether the duration of transmitting the radio frequency signal by using the second antenna reaches the length of the second time period, and if the duration of transmitting the radio frequency signal by using the second antenna reaches the length of the second time period, perform step S121.

Step S121: Switch the second antenna to the first antenna, and go back to step S101.

That is, when the duration of transmitting the radio frequency signal by using the second antenna reaches the length of the second time period, use of the first antenna stops and the radio frequency signal starts being transmitted by using the second antenna.

Specifically, the following separately describes step S109 to step S119 with reference to FIG. 5a and FIG. 5b. FIG. 5a is a time sequence diagram of antenna transmit power of a wireless communications device when a second antenna is a safety antenna. FIG. 5b is a time sequence diagram of antenna transmit power of a wireless communications device when a second antenna is a non-safety antenna. In FIG. 5a and FIG. 5b, the length of the first time period and the length of the second time period are preset in the wireless communications device.

As shown in FIG. 5a, when the transmit power of the first antenna is greater than the first preset power, the radio frequency signal continues being transmitted by using the first antenna, and a transmission time of the first antenna (that is, the duration of transmitting the radio frequency signal by using the first antenna) starts being counted. When the transmission time of the first antenna, that is, t1 in FIG. 5a is equal to a length T1 of the first time period, the radio frequency signal stops being transmitted by using the first antenna, and the first antenna is switched to the second antenna to transmit the radio frequency signal. T1 is less than a test time Tmax. A transmission time of transmitting the radio frequency signal by using the second antenna, that is, duration t2 of transmitting the radio frequency signal by using the second antenna is calculated. Because communication performance of the first antenna is better than communication performance of the second antenna, when the duration t2 of transmitting the radio frequency signal by using the second antenna is equal to a length T2 of the second time period, the radio frequency signal stops being transmitted by using the second antenna, and the second antenna is switched to the first antenna to transmit the radio frequency signal. When it is ensured that the SAR value of the wireless communications device does not exceed a limit, communication quality of the communications device is optimized.

After the first antenna is switched back to, it is detected again whether the transmit power of the first antenna is greater than the first preset power. It may be learned from FIG. 5a that after the transmit power of the first antenna is greater than the first preset power, each transmission time of the first antenna is equal to the length T1 of the first time period, that is, t1=t1'=t1"=T1. After antenna switching is performed, each duration of transmitting the radio frequency signal by using the second antenna is equal to the length T2 of the second time period, that is, t2=t2'=t2"=T2. If the transmit power of the first antenna is not greater than the first preset power, the transmission time of the first antenna does not need to be counted and antenna switching does not need to be performed. In FIG. 5a, transmit power of an antenna 1 and transmit power of an antenna 2 may be constant or may be not constant, and this depends on a chip that controls antenna transmit power.

Different from FIG. 5a, in FIG. 5b, the second antenna is a non-safety antenna, and the transmit power of the second antenna is greater than the second preset power. In FIG. 5b, each duration of transmitting the radio frequency signal by using the second antenna is equal to a length T2' of the second time period, that is, t2=t2'=t2"=T2'. The length T2' of the second time period is less than the test time Tmax.

Therefore, after transmission is continuously performed for T2' by using the second antenna at transmit power that is greater than the second preset power and that is less than or equal to maximum transmit power, the SAR value of the wireless communications device does not exceed a limit. The first time period T1' and the length T2' of the second time period may be fixed values, or may correspondingly vary with different transmit power of the first antenna and different transmit power of the second antenna respectively. A combination of the values of the first time period T1' and the length T2' of the second time period and values of the transmit power of the first antenna and the transmit power of the second antenna may be prestored in the wireless communications device in a form of a mapping relationship.

Table 1 is a result of testing the SAR value of the wireless communications device in different scenarios. It may be learned, from Table 1, that when switching is performed between the first antenna and the second antenna according to setting, a detected SAR value of the wireless communications device is effectively reduced.

TABLE 1

| Setting | SAR value of a 1 g absorber (Wt/kg) | SAR value of a 10 g absorber (Wt/kg) |
|---|---|---|
| Transmission is continuously performed by using the first antenna, and the first antenna is not switched to the second antenna. | 1.73 | 0.863 |
| Switching is performed between two antennas, and t1 = t2 = 1s. | 1.18 | 0.417 |
| Switching is performed between two antennas, and t1 = t2 = 0.5s. | 0.92 | 0.407 |

Table 2 is a result of testing call drop performance of the wireless communications device during switching in different scenarios. It may be learned from Table 2 and Table 3 that when switching is performed between the first antenna and the second antenna according to setting, communication performance of the wireless communications device is effectively improved in comparison with a method for controlling the SAR value of the wireless communications device through power backoff.

TABLE 2

| Scenario | SAR Mechanism | Degraded signal while dropping call | Result |
|---|---|---|---|
| Free Space | Backoff (3 dB) | 40.05 | Bad |
| Free Space | Switching between two antennas (1s) | 43.15 | Good |

TABLE 3

| Scenario | SAR Mechanism | Degraded signal while dropping call | Result |
|---|---|---|---|
| Hand + Head | Backoff (3 dB) | 31.45 | Bad |
| Hand + Head | Switching between two antennas (1s) | 34.3 | Good |

Embodiment 2

Figure 6A:
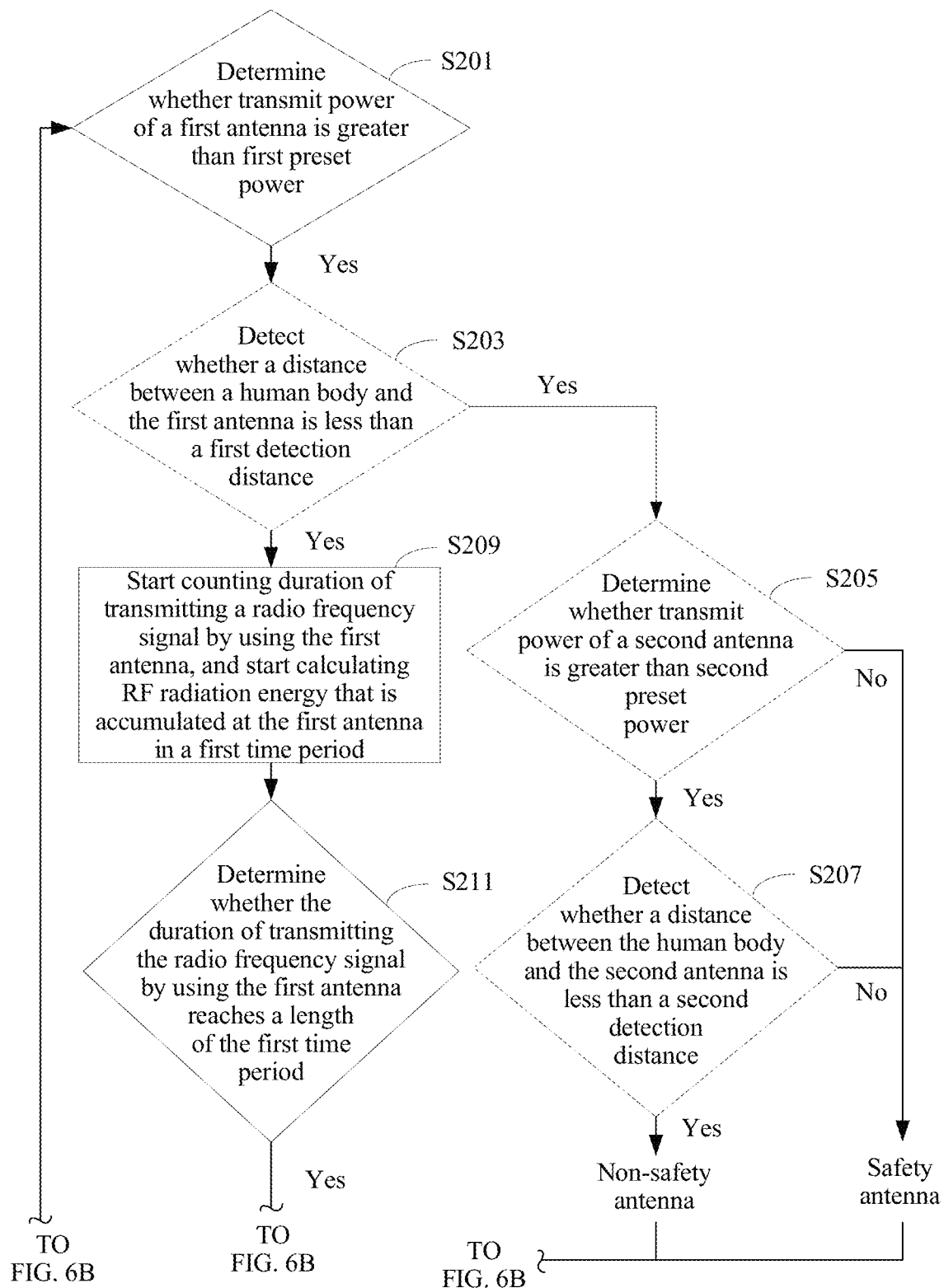
FIG. 6A and FIG. 6B are a schematic flowchart of a second embodiment of a method for controlling an SAR of a wireless communications device according to the present invention.
Figure 6B:
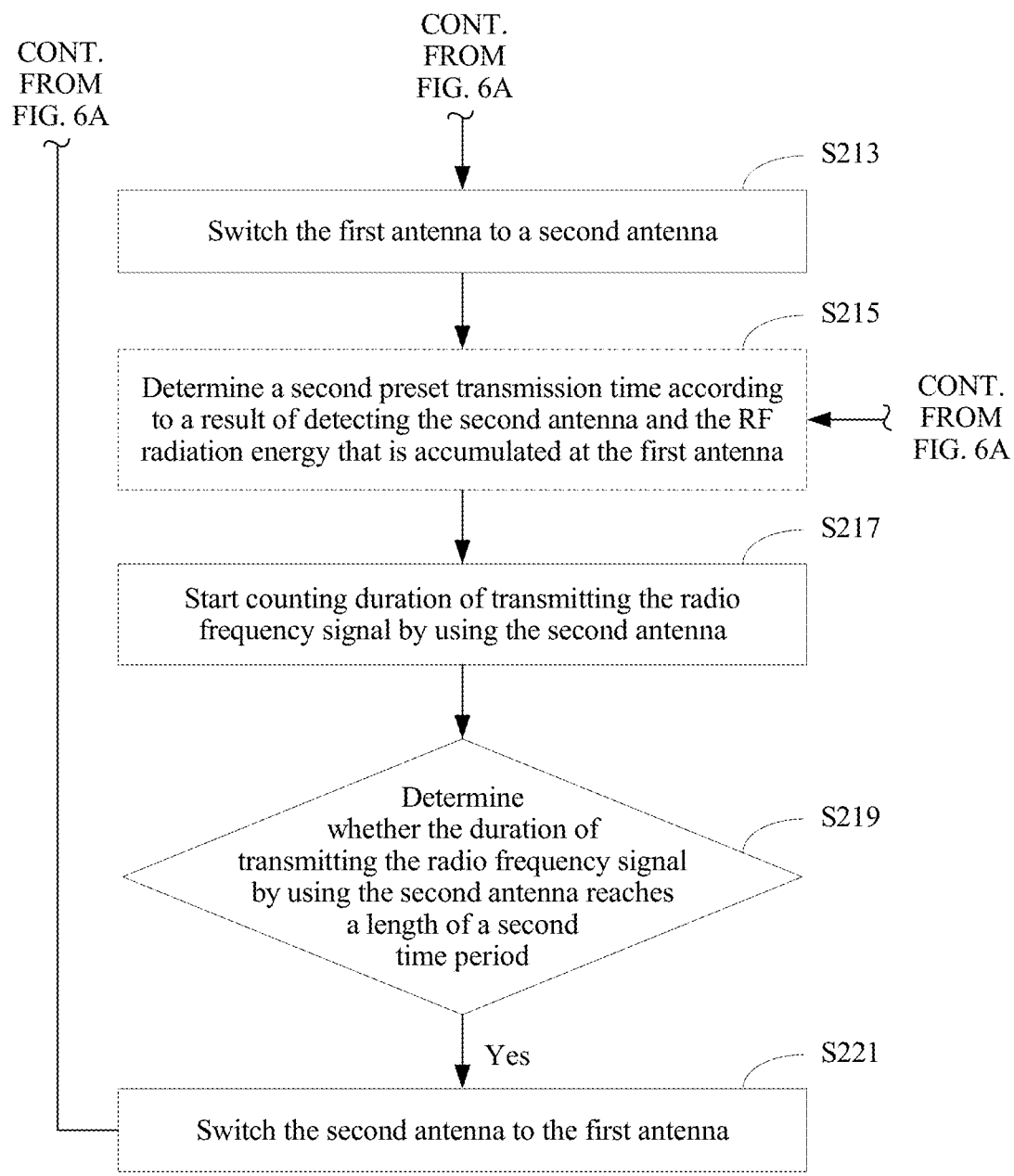
Figure 6A:
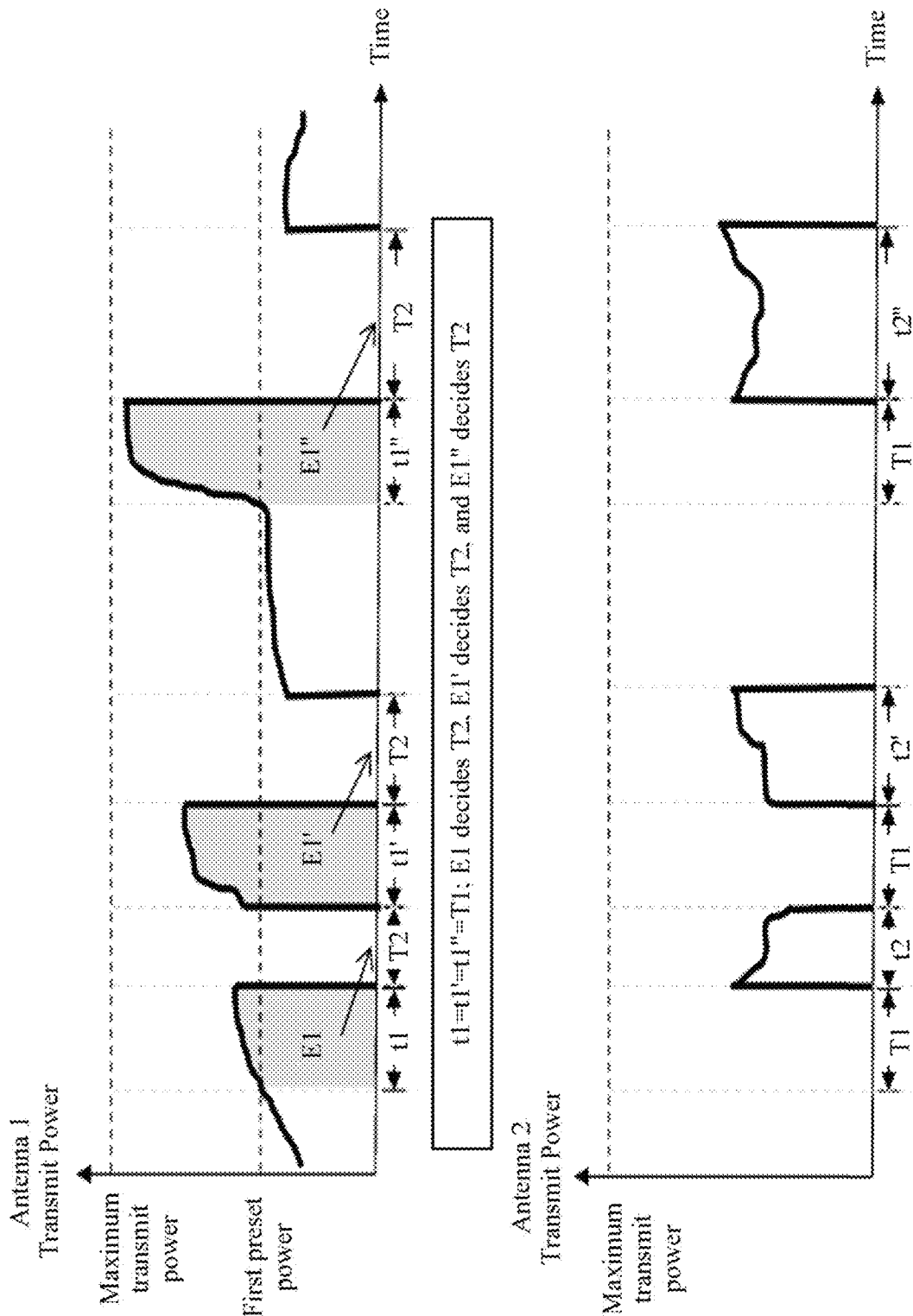
Figure 6B:
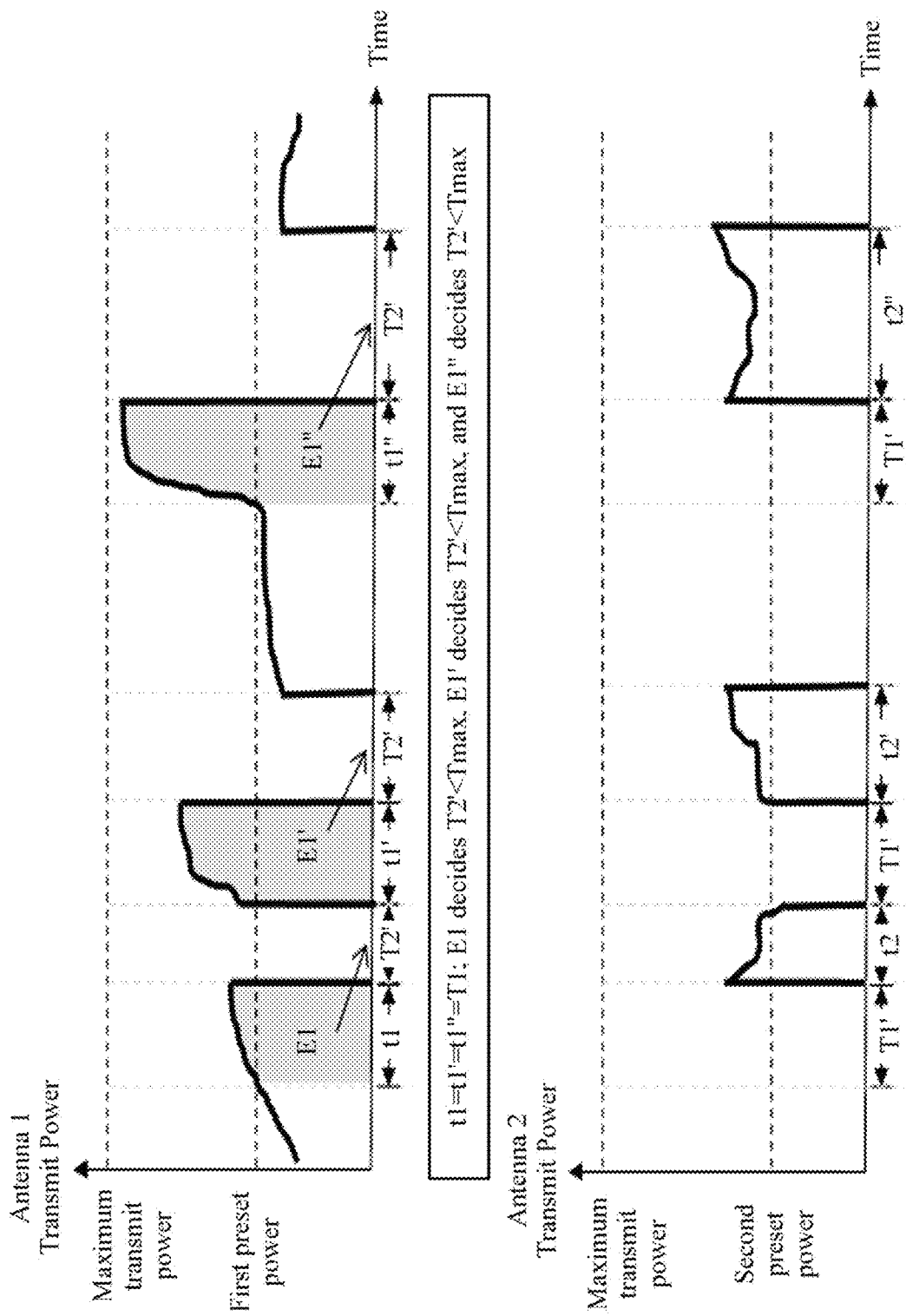

FIG. 6A and FIG. 6B are a schematic flowchart of a second embodiment of a method for controlling an SAR of a wireless communications device according to the present invention. As shown in FIG. 6A and FIG. 6B, a method 2000 includes the following steps.

Step S201 to step S207 are similar to step S101 to step S107 in the procedure shown in FIG. 5A and FIG. 5B. For specific content, refer to descriptions in step S101 to step S107. For a brief description, details are not described herein again.

Optionally, the detection module may be omitted in the wireless communications device. That is, step S203 and/or step S207 may be omitted. When step S203 is omitted, if the transmit power of the first antenna is greater than the first preset power, the first antenna may cause that an SAR value of the wireless communications device exceeds a limit. When step S207 is omitted, if the transmit power of the second antenna is greater than the second preset power, the second antenna is a non-safety antenna.

Optionally, step S205 and step S207 may be omitted. When step S205 and step S207 are omitted, it is considered by default that the second antenna is a non-safety antenna.

Step S209: Start counting duration of transmitting the radio frequency signal by using the first antenna, and start calculating RF radiation energy that is accumulated at the first antenna in a first time period.

There are a plurality of specific methods for determining the RF radiation energy, and this is not specifically limited herein. For example, a mapping table between transmit power and RF radiation energy is preset in the wireless communications device, and the mapping table includes a mapping relationship between RF radiation energy and a sum of transmit power. In the first time period, a plurality of values of the transmit power of the first antenna are detected in real time or detected through timing sampling. In the first time period, integral calculation is performed on the plurality of values of the transmit power of the first antenna, so as to obtain a sum. Then a value of RF radiation energy corresponding to the sum of the values of the power is determined by searching the table.

Step S211: Determine whether the duration of transmitting the radio frequency signal by using the first antenna reaches a length of the first time period, and if the duration of transmitting the radio frequency signal by using the first antenna reaches the length of the first time period, perform step S213.

Step S213: Switch, from the first antenna to the second antenna, an antenna that is of the wireless communications device and that is used to transmit the radio frequency signal.

Step S215: Determine a length of a second time period according to the RF radiation energy that is accumulated at the first antenna in the first time period and a result of detecting the second antenna.

When the second antenna is a safety antenna, the length of the second time period is determined according to the RF radiation energy that is accumulated at the first antenna in the first time period. When the RF radiation energy at the first antenna is high, an RF transmission time of the second antenna is prolonged, so as to offload the RF radiation energy that is accumulated at the first antenna, and prevent the SAR value of the wireless communications device from exceeding a limit. When the RF radiation energy at the first antenna is low, because communication performance of the first antenna is usually better than communication performance of the second antenna, an RF data transmission time of the second antenna is shortened, so that the wireless communications device switches to the first antenna as soon as possible to transmit the radio frequency signal.

In the first time period, the second antenna is a non-safety antenna, and the SAR value of the wireless communications device also exceeds a limit if the second antenna is always used. Therefore, the length of the second time period needs to be determined according to a test time and the RF radiation energy that is accumulated at the first antenna in the first time period. A determining method is the same as the determining method used when the second antenna is a safety antenna. A difference is that the length of the second time period is less than a total test time. After the radio frequency signal is transmitted by using the second antenna for a period of time, the second antenna needs to be switched back to the first antenna again, so as to reduce RF radiation energy that is accumulated at the second antenna. Although neither the first antenna nor the second antenna is a safety antenna, because RF radiation energy that is accumulated at both the two antennas is relatively low, the SAR value of the whole wireless communications device does not exceed a limit.

Optionally, the length of the second time period may be preset in the wireless communications device. A plurality of values may be set for the length of the second time period according to different transmit power of the second antenna.

Optionally, a value of the length of the second time period is a time length required for reducing the RF radiation energy that is accumulated at the first antenna to zero.

Optionally, the length of the second time period is equal to the length of the first time period.

When step S205 and step S207 are omitted, it is considered by default that the second antenna is a non-safety antenna. In step S215, the length of the second time period is determined according to the RF radiation energy that is accumulated at the first antenna in the first time period.

Step S217: Start counting duration of transmitting the radio frequency signal by using the second antenna.

Step S219: Determine whether the duration of transmitting the radio frequency signal by using the second antenna reaches the length of the second time period, and if the duration of transmitting the radio frequency signal by using the second antenna reaches the length of the second time period, perform step S221.

Step S221: Switch the second antenna to the first antenna, and go back to step S201.

Different from the method 1000, in the method 2000, the length of the second time period is not a preset value, and is determined according to the RF radiation energy that is accumulatively generated at the first antenna in the first time period, and a length of the transmission time of the second antenna is dynamically adjusted.

In the technical solution in this embodiment of the present invention, when it is ensured that the SAR value of the wireless communications device does not exceed a limit, a time of transmitting the radio frequency signal by using the second antenna is shortened, so as to improve communication quality of the wireless communications device. For a step that is in the method 2000 and that is corresponding to that in the method 1000, refer to specific descriptions in the method 1000. Details are not described herein again.

Specifically, the following separately describes step S209 to step S211 with reference to FIG. 6a and FIG. 6b. FIG. 6a is a time sequence diagram of antenna transmit power of a wireless communications device when a second antenna is a safety antenna. FIG. 6b is a time sequence diagram of antenna transmit power of a wireless communications device when a second antenna is a non-safety antenna.

As shown in FIG. 6a, when the transmit power of the first antenna is greater than the first preset power, the radio frequency signal continues being transmitted by using the first antenna, a transmission time of the first antenna starts being counted, and RF radiation energy E1 that is accumulatively generated at the first antenna is calculated. When duration t1 of continuing transmitting the radio frequency signal by using the first antenna is equal to a length T1 of the first time period, the radio frequency signal stops being transmitted by using the first antenna, and the first antenna is switched to the second antenna to transmit the radio frequency signal. T1 is less than a test time Tmax. Duration t2 of transmitting the radio frequency signal by using the second antenna starts being counted. A length T2 of the second time period is determined according to the RF radiation energy E1 that is accumulated at the first antenna. Larger RF radiation energy E1 indicates a longer time T2, and smaller RF radiation energy E1 indicates a shorter time T2. When the duration t2 of transmitting the radio frequency signal by using the second antenna is equal to the length T2 of the second time period, the radio frequency signal stops being transmitted by using the second antenna, and the second antenna is switched to the first antenna to transmit the radio frequency signal. The transmission time of the second antenna is determined according to the RF radiation energy that is accumulated at the first antenna, so that when it is ensured that the SAR value of the wireless communications device does not exceed a limit, the data transmission time of the first antenna is prolonged as far as possible, so as to optimize communication quality of the wireless communications device.

After the first antenna is switched back to, it is detected again whether the transmit power of the first antenna is greater than the first preset power. It may be learned from FIG. 6a that after the transmit power of the first antenna is greater than the first preset power, each transmission time of the first antenna is equal to the first time period T1, that is, t1=t1'=t1"=T1. After antenna switching is performed, the duration of transmitting the radio frequency signal by using the second antenna varies with the length T2 of the second time period determined during each switching. If the transmit power of the first antenna is not greater than the first preset power, the transmission time of the first antenna does not need to be counted and antenna switching does not need to be performed. In FIG. 6a, transmit power of an antenna 1 and transmit power of an antenna 2 may be constant or may be not constant, and this depends on control of a chip that controls an antenna.

Different from FIG. 6a, in FIG. 6b, the second antenna is a non-safety antenna, and the transmit power of the second antenna is greater than the second preset power. Therefore, a length T2' that is of the second time period of the second antenna and that is determined according to the RF radiation energy E1 needs to be less than the test time Tmax.

Embodiment 3

Figure 7A:
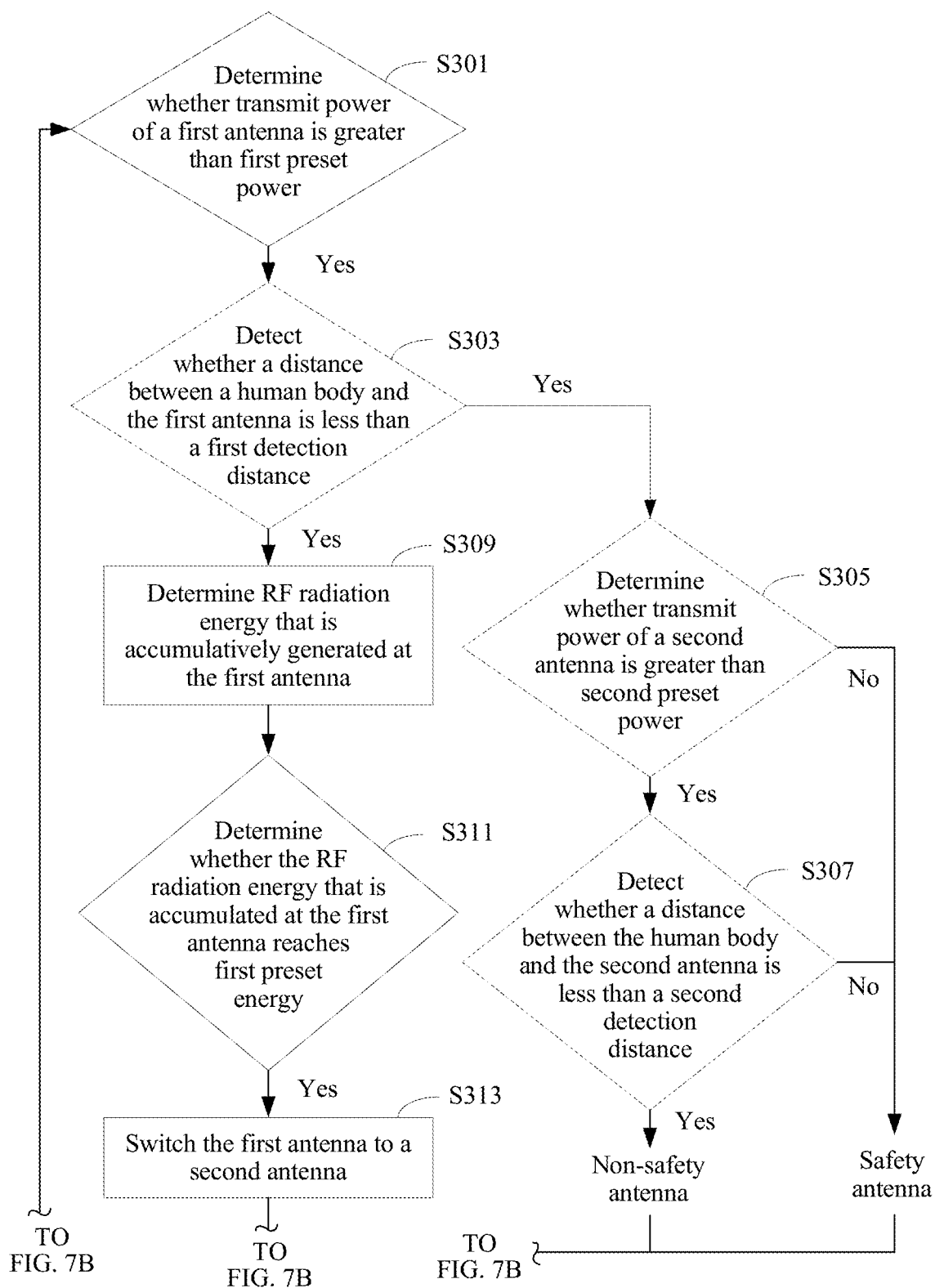
FIG. 7A and FIG. 7B are a schematic flowchart of a third embodiment of a method for controlling an SAR of a wireless communications device according to the present invention.
Figure 7B:
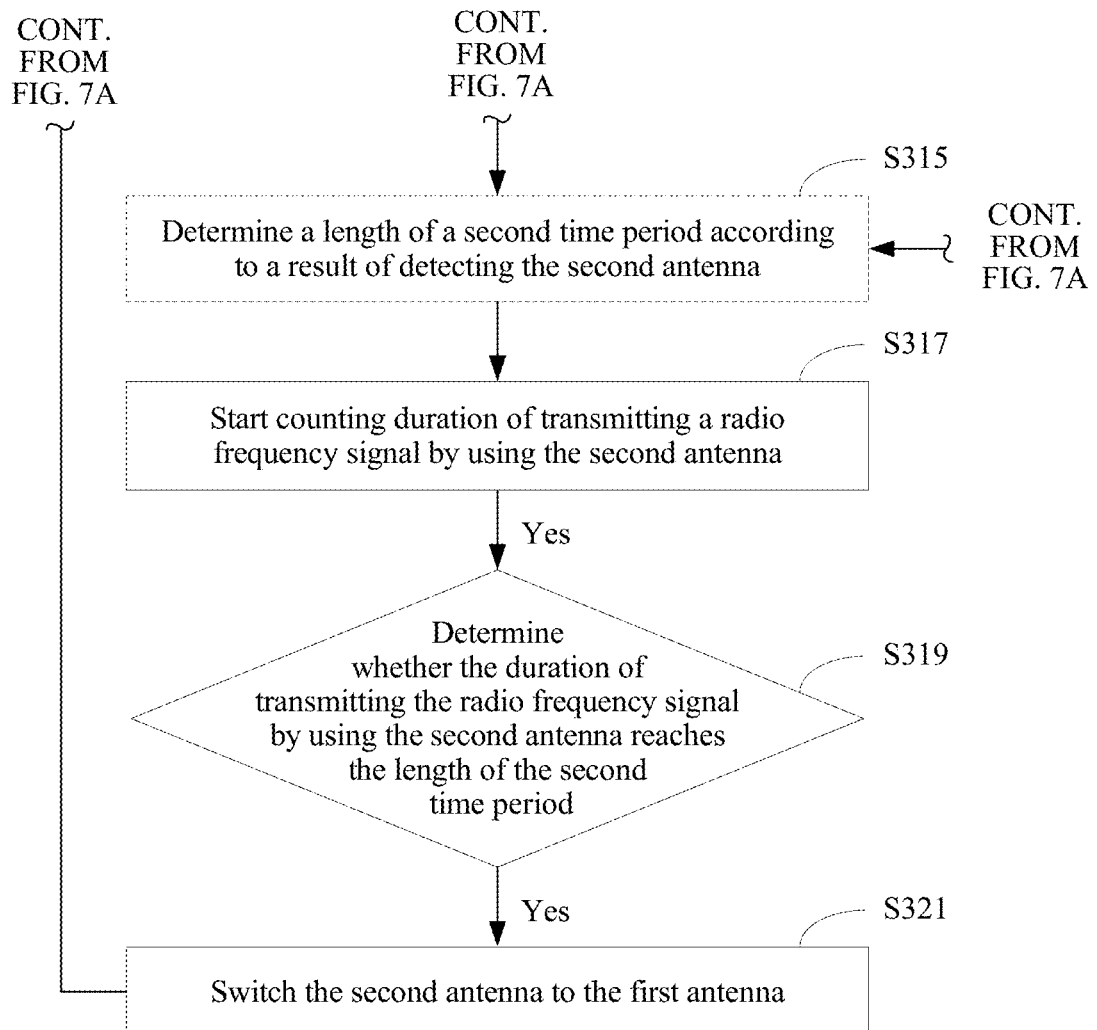
Figure 7A:
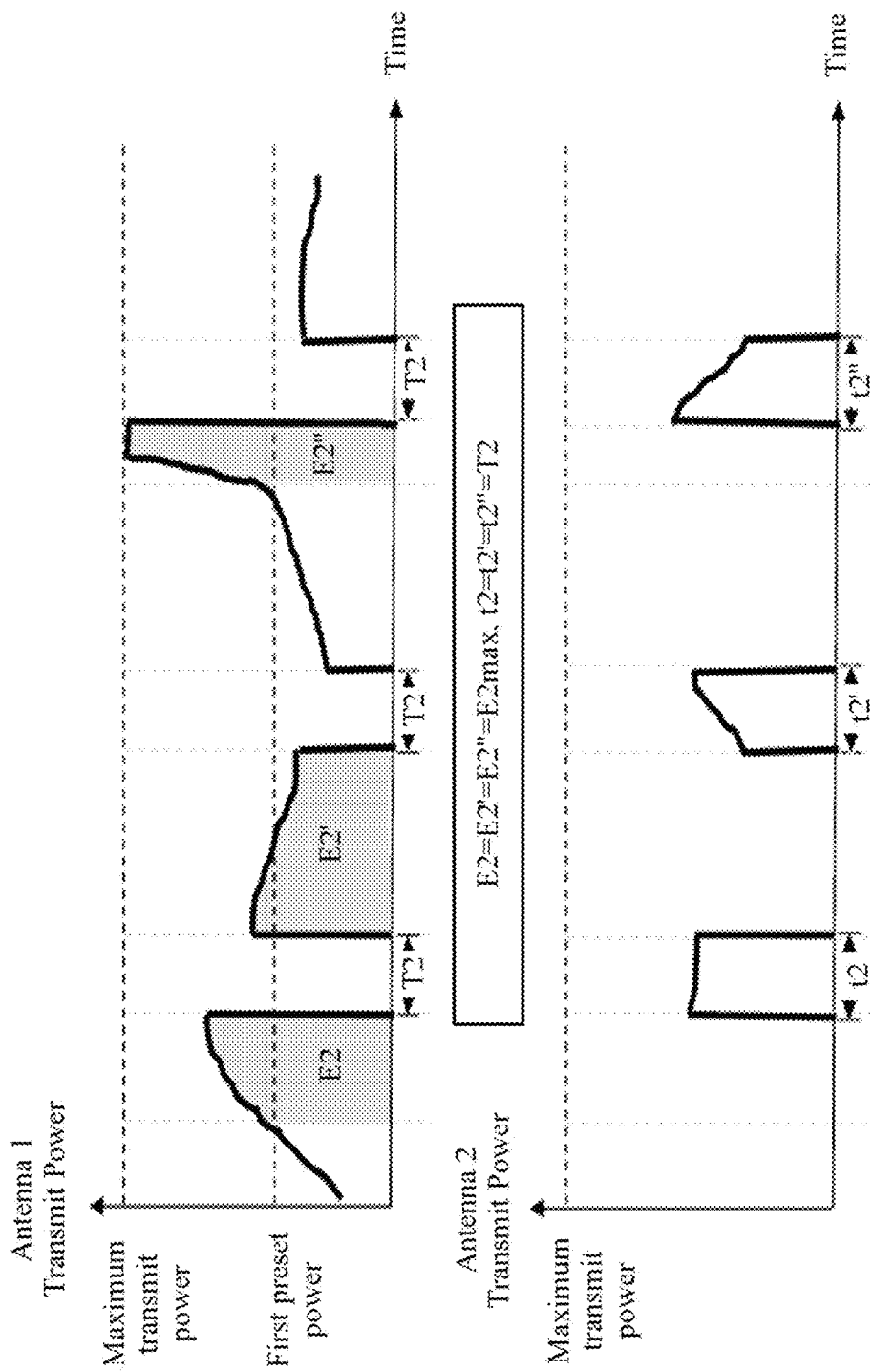
Figure 7B:
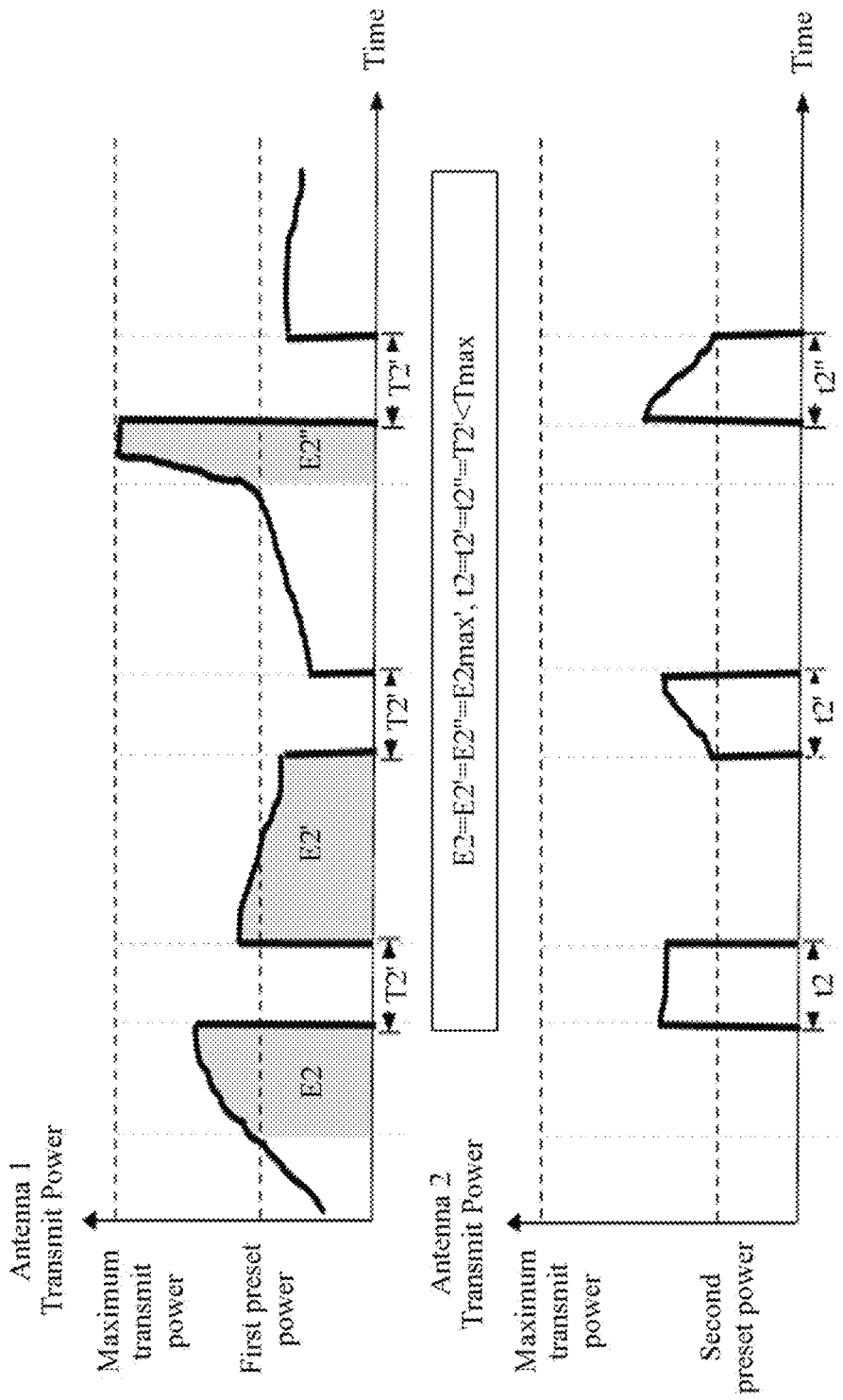

FIG. 7A and FIG. 7B are a schematic flowchart of a third embodiment of a method for controlling an SAR of a wireless communications device according to the present invention. As shown in FIG. 7A and FIG. 7B, a method 3000 includes the following steps.

Step S301 to step S307 are similar to step S101 to step S107 in the procedure shown in FIG. 5A and FIG. 5B. For specific content, refer to descriptions in step S101 to step S107. For a brief description, details are not described herein again.

Step S309: When the transmit power of the first antenna is greater than the first preset power, determine RF radiation energy that is accumulatively generated at the first antenna.

Step S311: Determine whether the RF radiation energy that is accumulatively generated at the first antenna reaches first preset energy, and when the RF radiation energy that is accumulated at the first antenna reaches the first preset energy, perform step S213.

Step S313: Switch, from the first antenna to the second antenna, an antenna that is of the wireless communications device and that is used to transmit the radio frequency signal.

Step S315: Determine a length of a second time period according to a result of detecting the second antenna.

When the second antenna is a safety antenna, duration of transmitting the radio frequency signal by using the second antenna does not cause that an SAR value of the wireless communications device exceeds a limit. When the second antenna is a non-safety antenna, excessively long duration of transmitting the radio frequency signal by using the second antenna causes that an SAR value of the wireless communications device exceeds a limit. Therefore, the length of the second time period cannot exceed a test time. The length of the second time period may be preset in the wireless communications device, and different values may be separately set according to whether the second antenna is a safety antenna.

Optionally, a plurality of values may be set for the length of the second time period according to different transmit power of the second antenna.

Optionally, a value of the length of the second time period is a time length required for reducing the RF radiation energy that is accumulated at the first antenna to zero.

Optionally, the length of the second time period is equal to a length of a first time period. When step S305 and step S307 are omitted, it is considered by default that the second antenna is a non-safety antenna, and step S315 is correspondingly omitted.

Step S317: Start counting duration of transmitting the radio frequency signal by using the second antenna.

Step S319: Determine whether the duration of transmitting the radio frequency signal by using the second antenna reaches the length of the second time period, and if the duration of transmitting the radio frequency signal by using the second antenna reaches the length of the second time period, perform step S321.

Step S321: Switch, from the second antenna to the first antenna, an antenna that is of the wireless communications device and that is used to transmit the radio frequency signal, and go back to step S301.

Different from the method 1000, in the method 3000, the length of the first time period is not preset in the wireless communications device, but a value of the first preset energy is preset in the wireless communications device. When the transmit power of the first antenna is greater than the first preset power, the radio frequency signal continues being transmitted by using the first antenna, and a value of RF radiation energy that is accumulated when the radio frequency signal continues being transmitted by using the first antenna starts being calculated. When the RF radiation energy that is accumulated at the first antenna reaches the first preset energy, the antenna that is of the wireless communications device and that is used to transmit the radio frequency signal is switched to the second antenna. The first preset energy is less than RF radiation energy that is at the first antenna and that is corresponding to an SAR upper limit value specified in an SAR standard. Therefore, before the RF radiation energy that is accumulated at the first antenna reaches the first preset energy, the radio frequency signal stops being transmitted by using the first antenna, and the RF radiation energy at the first antenna stops increasing, so that an SAR value at the first antenna does not exceed a limit.

When the transmit power of the first antenna is high, the accumulated RF radiation energy reaches the first preset energy in a relatively short time. Correspondingly, an RF data transmission time of the first antenna becomes shorter, and the SAR value of the wireless communications device is prevented from exceeding a limit. When the transmit power of the first antenna is low, the accumulated RF radiation energy reaches the first preset energy in a relatively long time. Correspondingly, an RF data transmission time of the first antenna becomes longer. Because communication performance of the first antenna is usually better than communication performance of the second antenna (for example, the first antenna is a full-band antenna, and the second antenna is a narrow-band antenna), when it is ensured that the SAR value of the wireless communications device does not exceed a limit, a time of transmitting the radio frequency signal by using the first antenna is prolonged, so as to improve communication quality of the wireless communications device. For a step that is in the method 3000 and that is corresponding to that in the method 1000, refer to specific descriptions in the method 1000. Details are not described herein again. Specifically, the following separately describes step S309 to step S319 with reference to FIG. 7a and FIG. 7b. FIG. 7a is a time sequence diagram of antenna transmit power of a wireless communications device when a second antenna is a safety antenna. FIG. 7b is a time sequence diagram of antenna transmit power of a wireless communications device when a second antenna is a non-safety antenna.

As shown in FIG. 7a, when the transmit power of the first antenna is greater than the first preset power, the radio frequency signal continues being transmitted by using the first antenna, and RF radiation energy E2 that is accumulated at the first antenna is calculated. When the RF radiation energy E2 that is accumulated at the first antenna reaches first preset energy E2max, the first antenna is switched to the second antenna to transmit the radio frequency signal. A transmission time of transmitting the radio frequency signal by using the second antenna, that is, duration t2 of transmitting the radio frequency signal by using the second antenna starts being counted. Because communication performance of the first antenna is better than communication performance of the second antenna, when the duration t2 of transmitting the radio frequency signal by using the second antenna is equal to a length T2 of the second time period, the radio frequency signal stops being transmitted by using the second antenna, and the second antenna is switched to the first antenna to transmit the radio frequency signal.

After the first antenna is switched back to, it is detected again whether the transmit power of the first antenna is greater than the first preset power. It may be learned from FIG. 7a that when the transmit power of the first antenna is greater than the first preset power, RF radiation energy that is accumulated when the radio frequency signal continues being transmitted by using the first antenna keeps unchanged, and antenna switching is performed when the RF radiation energy reaches the first preset energy E2max, that is, $E2=E2'=E2''=E2max$. After antenna switching is performed, duration of transmitting the radio frequency signal by using the second antenna keeps unchanged, and is equal to the length T2 of the second time period, that is, $t2=t2'=t2''=T2$. If the transmit power of the first antenna is not greater than the first preset power, energy at the first antenna does not need to be monitored and antenna switching does not need to be performed. In FIG. 7a, transmit power of an antenna 1 and transmit power of an antenna 2 may be constant or may be not constant, and this depends on control of a chip that controls an antenna.

Different from FIG. 7a, in FIG. 7b, the second antenna is a non-safety antenna, and the transmit power of the second antenna is greater than the second preset power. Therefore, when the wireless communications device switches to the second antenna to transmit the radio frequency signal, because the transmit power of the second antenna is greater than the second preset power, the SAR value exceeds a limit when the second antenna is continuously used for a long time. Therefore, maximum duration of transmitting the radio frequency signal by using the second antenna cannot exceed a test time of detecting the SAR value. That is, a length T2' of the second time period is less than a test time Tmax. In FIG. 7b, E2=E2'=E2"=E2max, and t2=t2'=t2"=T2'<Tmax. The length T2' of the second time period needs to meet: after transmission is continuously performed for T2' by using the second antenna at transmit power greater than the second preset power and less than or equal to maximum transmit power, the SAR value of the wireless communications device does not exceed a limit. A value of the length T2' of the second time period may be prestored in the wireless communications device.

Optionally, in another embodiment, when the second antenna is a non-safety antenna, an energy monitoring manner is used as a triggering condition of switching the second antenna back to the first antenna. That is, when the first antenna is switched to the second antenna, because the second antenna is a non-safety antenna, energy at the second antenna is also monitored, so as to prevent the second antenna from causing that the SAR value of the wireless communications device exceeds a limit. When the radio frequency signal starts being transmitted by using the second antenna, a value of RF radiation energy that is accumulated at the second antenna is calculated. When the RF radiation energy that is accumulated at the second antenna is greater than or equal to the second preset energy, the first antenna is switched to the second antenna to transmit the radio frequency signal. The second preset energy is less than RF radiation energy that is at the second antenna and that is corresponding to the SAR upper limit value specified in the SAR standard. The second preset energy may be prestored in the wireless communications device.

Figure 7C:
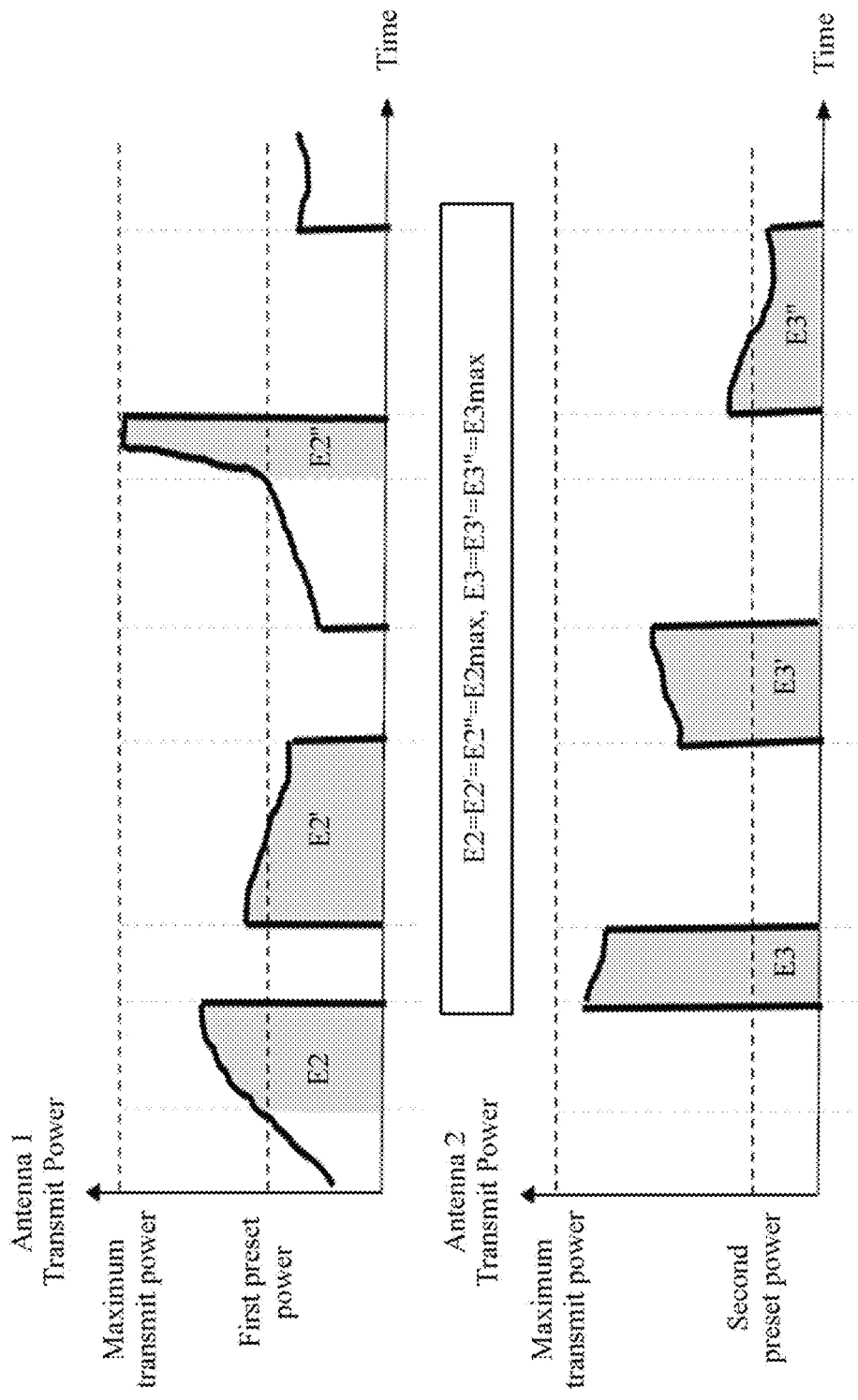
FIG. 7c is a time sequence diagram of antenna transmit power of a wireless communications device when a second antenna is a non-safety antenna.

FIG. 7c is a time sequence diagram of antenna transmit power of a wireless communications device when a second antenna is a non-safety antenna. It may be learned from FIG. 7c that when the transmit power of the first antenna is greater than the first preset power, the radio frequency signal continues being transmitted by using the first antenna. When RF radiation energy E2 that is accumulated at the first antenna reaches first preset energy E2max, an antenna that is of the wireless communications device and that is used for data transmission is switched to the second antenna. If the transmit power of the second antenna is greater than the second preset power, RF radiation energy E3 that is accumulated at the second antenna in a data transmission process is calculated. If the RF radiation energy E3 that is accumulated at the second antenna in the data transmission process reaches second preset energy E3max, the second antenna is switched back to the first antenna to transmit the radio frequency signal. The transmit power of the first antenna is monitored again.

When the transmit power of the first antenna and the transmit power of the second antenna dynamically change, RF radiation energy at the first antenna and RF radiation energy at the second antenna are directly detected, so as to optimize communication performance while the SAR value does not exceed a limit.

Embodiment 4

With reference to the foregoing embodiments, when transmit power of a second antenna is less than second preset power or the second antenna is far away from a human body, the second antenna is a safety antenna. In the foregoing embodiments (as shown in FIG. 5a, FIG. 6a, and FIG. 7a), it is considered by default that communication performance of a first antenna is better than communication performance of the second antenna. Therefore, even if the second antenna is a safety antenna, it is expected that duration of transmitting a radio frequency signal by using the second antenna should be as short as possible, and the radio frequency signal is transmitted by using the first antenna whenever possible. However, the communication performance of the second antenna may be better than the communication performance of the first antenna in many cases. For example, a frequency band of the second antenna is wider than a frequency band of the first antenna, or because the first antenna is gripped by a user, a signal is interfered with, and "death grip" occurs.

When the second antenna is a safety antenna, and the communication performance of the second antenna is better, a data transmission time of the second antenna may be prolonged.

Figure 8:
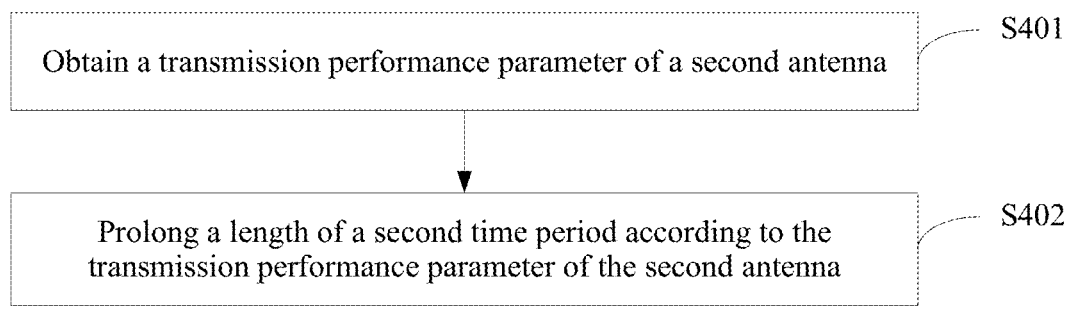
FIG. 8 is a flowchart of a method for adjusting duration of transmitting a radio frequency signal by using a second antenna with reference to the foregoing embodiment.

FIG. 8 is a flowchart of a method for adjusting duration of transmitting a radio frequency signal by using a second antenna with reference to the foregoing embodiment. As shown in FIG. 8, in addition to steps in the foregoing embodiment, a method 4000 in this embodiment includes:

Step S401: Obtain a transmission performance parameter of the second antenna when a radio frequency signal is transmitted by using the second antenna.

Step S402: Prolong a length of the second time period according to the transmission performance parameter of the second antenna.

Step S401 and step S402 may be performed before duration of transmitting the radio frequency signal by using the second antenna is determined and after the length of the second time period is determined according to a result of detecting the second antenna.

Specifically, the transmission performance parameter of the second antenna includes but is not limited to one or more of the following parameters: transmit power of the second antenna, reference signal received power (Reference Signal Received Power) of the second antenna, signal strength of the second antenna, or the like.

Figure 8A:
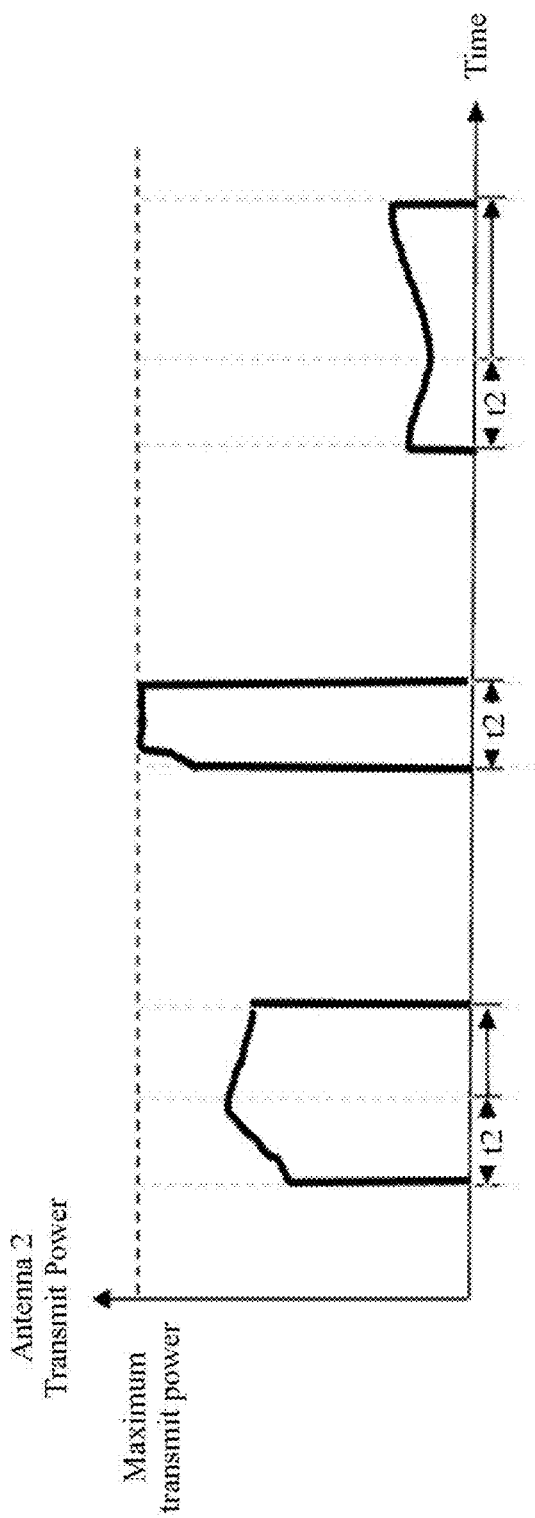
FIG. 8a is a schematic diagram of adjusting duration of transmitting a radio frequency signal by using a second antenna according to transmit power of the second antenna when the second antenna is a safety antenna.

FIG. 8a is a schematic diagram of adjusting duration of transmitting a radio frequency signal by using a second antenna according to transmit power of the second antenna when the second antenna is a safety antenna. As shown in FIG. 8a, when the transmit power of the second antenna is low, a receiving status of a base station is good, and in this case, communication performance of the second antenna is relatively good. Therefore, the duration of transmitting the radio frequency signal by using the second antenna is prolonged, that is, the length of the second time period determined in Embodiment 1 to Embodiment 3 is prolonged. In this way, when a wireless communications device meets a requirement for an SAR value, antenna switching is reduced, and communication quality of the wireless communications device is further optimized. When the transmit power of the second antenna is relatively high, uplink transmission of the wireless communications device is limited. Therefore, the duration of transmitting the radio frequency signal by using the second antenna is not prolonged, that is, the length of the second time period determined in Embodiment 1 to Embodiment 3 is not prolonged.

In another embodiment, when the second antenna is a non-safety antenna, whether a next-round antenna switching parameter is adjusted may be determined according to a current-round antenna transmission performance parameter (in Embodiment 1, a switching parameter is the first time period T1 and the length T2 of the second time period; in Embodiment 2, a switching parameter is the first time period T1 and the maximum length T2max of the second time period; in Embodiment 3, a switching parameter is the first preset energy E2max and the length T2 of the second time period or the second preset energy E3max). An adjusted switching parameter is a switching parameter that still meets an SAR standard after a lab test, and the adjusted switching parameter is also preset in the wireless communications device.

For example, for the switching parameter in Embodiment 1, it is assumed that in first-round antenna switching, it is determined that the first time period T1 of the first antenna is equal to 1 s, and the length T2 of the second time period of the first antenna is equal to 1s. If it is determined, in a first-round transmission process by using an antenna, that performance of an antenna 1 is better than that of an antenna 2, the first time period T1 of the first antenna is equal to 1 s, and the length T2 of the second time period of the first antenna is equal to 0.5 s in second-round antenna switching.

For another example, for the switching parameter in Embodiment 2, it is assumed that in first-round antenna switching, it is determined that the first time period T1 of the first antenna is equal to 1 s, and the maximum length T2max of the second time period of the first antenna is equal to 0.5 s. If it is determined, in a first-round transmission process by using an antenna, that performance of an antenna 2 is better than that of an antenna 1, the first time period T1 of the first antenna is shortened, and the maximum length T2max of the second time period of the first antenna is increased in second-round antenna switching, to obtain a second-round antenna switching parameter: T1=0.5 s and T2max=1 s.

Figure 9:
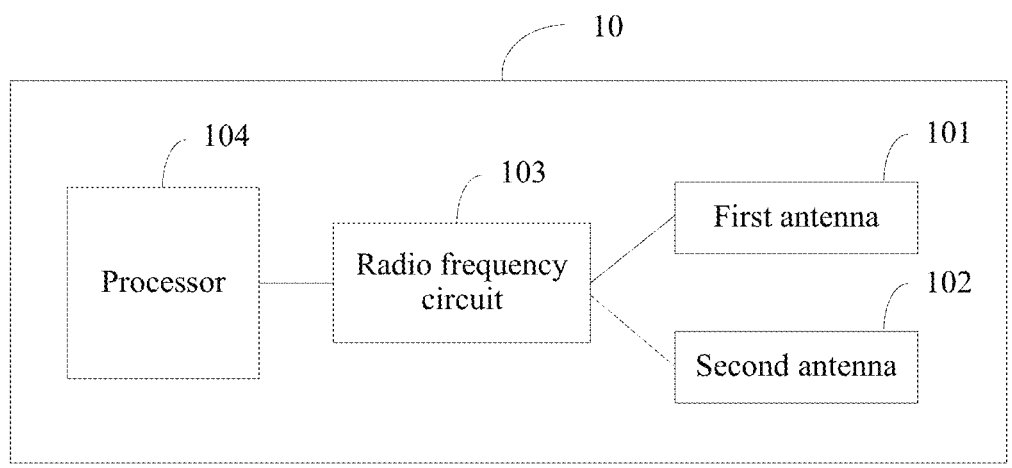
FIG. 9 is a possible schematic structural diagram of a wireless communications device in the foregoing embodiment.

FIG. 9 is a possible schematic structural diagram of a wireless communications device included in the foregoing embodiment.

A wireless communications device 10 includes a first antenna 101, a second antenna 102, a radio frequency circuit 103, and a processor/controller 104. The radio frequency circuit 103 may also be referred to as a radio frequency transceiver circuit. A person skilled in the art can understand that the structure of the wireless communications device shown in FIG. 9 constitutes no limitation on the wireless communications device. The wireless communications device may include more or fewer components than those shown in the diagram, or may combine some components, or may split some components, or may have different component arrangements.

The first antenna 101 is configured to transmit a radio frequency signal, and the second antenna is configured to transmit a radio frequency signal, where a distance between positions of the first antenna 101 and the second antenna 102 in the wireless communications device 10 is greater than a preset spacing. The radio frequency circuit 103 is communicatively connected to the first antenna 101 or the second antenna 102. The processor/controller 104 is communicatively connected to the radio frequency circuit 103.

The radio frequency circuit 103 is connected to the first antenna 101, and transmits a radio frequency signal by using the first antenna 101, when transmit power of the first antenna 101 is greater than first preset power.

The processor/controller 104 is configured to: when a first time period elapses, instruct the radio frequency circuit 103 to stop using the first antenna 101 and to start transmitting the radio frequency signal by using the second antenna 102, so that the wireless communications device meets an SAR standard.

The first preset power is equal to or less than transmit power that is of the first antenna 101 and that is corresponding to an SAR upper limit value specified in the SAR standard.

A start moment of the first time period is a moment when the transmit power of the first antenna 101 is greater than the first preset power, and a length of the first time period is less than test duration that is of an SAR test and that is specified in the SAR standard.

Specifically, the processor/controller 104 is further configured to monitor whether the transmit power of the first antenna 101 is greater than the first preset power.

Specifically, the processor/controller 104 is further configured to: when a second time period elapses, instruct the radio frequency circuit 103 to stop transmitting the radio frequency signal by using the second antenna 102 and to start transmitting the radio frequency signal by using another antenna, where a start moment of the second time period is a moment of starting transmitting the radio frequency signal by using the second antenna 102, and the another antenna is an antenna other than the second antenna 102 in the wireless communications device.

Specifically, the another antenna is the first antenna 101.

Specifically, the wireless communications device further includes: a first sensor, configured to detect a distance between a human body and the first antenna 101. The processor/controller 104 is further configured to: determine whether the distance between the human body and the first antenna 101 is less than a first detection distance, where the first detection distance is a distance that is between the wireless communications device and the human body during the SAR test and that is specified in the SAR standard; and if the transmit power of the first antenna 101 is greater than the first preset power and the distance between the human body and the first antenna 101 is less than the first detection distance, stop using the first antenna 101 and start transmitting the radio frequency signal by using the second antenna 102 when the first time period elapses.

Specifically, the length of the first time period is preset in the wireless communications device.

Specifically, the processor/controller 104 is further configured to: when the transmit power of the first antenna 101 is greater than the first preset power, start counting duration of transmitting the radio frequency signal by using the first antenna 101; and when the duration of transmitting the radio frequency signal by using the first antenna 101 reaches the length of the first time period, instruct the radio frequency circuit 103 to stop using the first antenna 101 and to start transmitting the radio frequency signal by using the second antenna 102.

Specifically, radio-frequency radiation energy generated when the radio frequency signal is transmitted by using the first antenna 101 in the first time period is less than or equal to first preset energy.

The first preset energy is equal to or less than radio-frequency radiation energy that is at the first antenna 101 and that is corresponding to the SAR upper limit value specified in the SAR standard.

Specifically, a length of the second time period is preset in the wireless communications device.

Specifically, the processor/controller 104 is further configured to:

determine a length of the second time period according to the radio-frequency radiation energy generated at the first antenna 101 in the first time period.

Specifically, the processor/controller 104 is further configured to: when the wireless communications device starts transmitting the radio frequency signal by using the second antenna 102, start counting duration of transmitting the radio frequency signal by using the second antenna 102; and when the duration of transmitting the radio frequency signal by using the second antenna 102 reaches the length of the second time period, instruct the radio frequency circuit 103 to stop using the first antenna 101 and to start transmitting the radio frequency signal by using the second antenna 102.

Specifically, radio-frequency radiation energy generated when the radio frequency signal is transmitted by using the second antenna 102 in the second time period is less than or equal to second preset energy, and the second preset energy is equal to or less than radio-frequency radiation energy that is at the second antenna 102 and that is corresponding to the SAR upper limit value specified in the SAR standard.

Specifically, the processor/controller 104 is further configured to: determine whether transmit power of the second antenna 102 is greater than second preset power, where the second preset power is equal to or less than transmit power that is of the second antenna 102 and that is corresponding to the SAR upper limit value specified in the SAR standard.

The wireless communications device further includes: a second sensor, configured to detect a distance between the human body and the second antenna 102.

The processor/controller 104 is further configured to: determine whether the distance between the human body and the second antenna 102 is less than a second detection distance; and if the transmit power of the second antenna 102 is greater than the second preset power and the distance between the human body and the second antenna 102 is less than the second detection distance, determine that the length of the second time period is less than test duration that is of the SAR test and that is specified in the SAR standard, so that the wireless communications device meets the SAR standard.

Specifically, the processor/controller 104 is further configured to: determine whether transmit power of the second antenna 102 is greater than second preset power, where the second preset power is equal to or less than transmit power that is of the second antenna 102 and that is corresponding to the SAR upper limit value specified in the SAR standard; obtain a transmission performance parameter of the second antenna 102 if the transmit power of the second antenna 102 is less than the second preset power; and prolong the length of the second time period according to the transmission performance parameter of the second antenna 102.

Alternatively, the wireless communications device further includes: a second sensor, configured to detect a distance between the human body and the second antenna 102. The processor/controller 104 is further configured to: determine whether the distance between the human body and the second antenna 102 is greater than a second detection distance; obtain a transmission performance parameter of the second antenna 102 if the distance between the human body and the second antenna 102 is greater than the second detection distance; and prolong the length of the second time period according to the transmission performance parameter of the second antenna 102.

The processor/controller 104 is configured to perform a processing process in FIG. 5A and FIG. 5B to FIG. 8 and/or another process used for the technology described in this application. For a brief description, details are not described herein again.

It should be understood that the wireless communications device 10 herein is only a simplified design. The term "processor" herein may be an application-specific integrated circuit (Application Specific Integrated Circuit, "ASIC" for short), an electronic circuit, a processor (such as a shared processor, a dedicated processor, or a group processor) for executing one or more software or firmware programs, a memory, a combined logic circuit, and/or another appropriate component that supports the described functions. In an optional example, a person skilled in the art may understand that the wireless communications device 10 may be configured to perform procedures and/or steps in the foregoing method embodiment. To avoid repetition, details are not described herein again.

In an implementation process, the steps in the foregoing method embodiment may be implemented by using an integrated logic circuit of hardware in the processor 104 or instructions in a form of software. The steps of the method disclosed with reference to the embodiments of the present invention may be directly performed by a hardware processor, or may be performed by using a combination of the hardware in the processor and a software module. The software module may be located in a mature storage medium in the art, such as a random access memory, a flash memory, a read-only memory, a programmable read-only memory, an electrically erasable programmable memory, or a register. The storage medium may be a memory, and the processor 104 reads information in the memory and completes the steps in the foregoing method in combination with the hardware in the processor. To avoid repetition, details are not described herein again.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for controlling a specific absorption rate (SAR) of a wireless communications device, comprising:
    transmitting, by the wireless communications device, a radio frequency signal using a first antenna, wherein the wireless communications device comprises the first antenna and a second antenna, wherein the first antenna has a first radius (x) of a first hotspot area, wherein the second antenna has a second radius (y) of a second hotspot area, wherein a unit measurement cube of an absorber has a length (z), wherein a distance (d) between positions of the first antenna and the second antenna in the wireless communications device is greater than a sum of x and y when the sum of x and y is greater than or equal to z, and wherein d is greater than z when the sum of x and y is less than z; and
    stop using the first antenna and start transmitting the radio frequency signal using the second antenna when transmit power of the first antenna is greater than first preset power and a first time period elapses to enable the wireless communications device to meet the SAR standard, wherein the first preset power is equal to or less than transmit power corresponding to an SAR upper limit value specified in the SAR standard, wherein a start moment of the first time period is a moment when the transmit power of the first antenna is greater than the first preset power, and wherein a length of the first time period is less than a test duration of an SAR test specified in the SAR standard.

2. The method of claim 1, wherein before the transmit power of the first antenna is greater than the first preset power, the method further comprises monitoring whether the transmit power of the first antenna is greater than the first preset power.

3. The method of claim 1, wherein when a second time period elapses, the method further comprises:
    stop transmitting the radio frequency signal using the second antenna; and
    start transmitting the radio frequency signal using another antenna, wherein a start moment of the second time period is a moment when the second antenna starts transmitting the radio frequency signal, and wherein the other antenna is an antenna other than the second antenna in the wireless communications device.

4. The method of claim 3, Wherein the other antenna is the first antenna.

5. The method of claim 3, wherein a length of the second time period is preset in the wireless communications device.

6. The method of claim 5, wherein stop transmitting the radio frequency signal using the second antenna and start transmitting the radio frequency signal using the other antenna comprises:
    start counting a duration of transmitting the radio frequency signal using the second antenna when the wireless communications device starts transmitting the radio frequency signal using the second antenna; and
    stop using the second antenna and start transmitting the radio frequency signal using the first antenna when the duration of transmitting the radio frequency signal using the second antenna reaches the length of the second time period.

7. The method of claim 3, further comprising determining a length of the second time period according to radio-frequency radiation energy generated at the first antenna in the first time period.

8. The method of claim 3, wherein radio-frequency radiation energy generated when the radio frequency signal is transmitted using the second antenna in the second time period is less than or equal to second preset energy, and wherein the second preset energy is equal to or less than radio-frequency radiation energy at the second antenna and corresponds to the SAR upper limit value specified in the SAR standard.

9. The method of claim 3, further comprising:
    determining whether transmit power of the second antenna is greater than second preset power, wherein the second preset power is equal to or less than transmit power of the second antenna and corresponds to the SAR upper limit value specified in the SAR standard;
    detecting a distance between a human body and the second antenna;
    determining whether the distance between the human body and the second antenna is less than a second detection distance; and
    determining that a length of the second time period is less than a test duration of the SAR test specified in the SAR standard when the transmit power of the second antenna is greater than the second preset power and the distance between the human body and the second antenna is less than the second detection distance to enable the wireless communications device to meet the SAR standard.

10. The method of claim 3, wherein the method further comprises either:
determining whether transmit power of the second antenna is greater than a second preset power, wherein the second preset power is equal to or less than transmit power of the second antenna and corresponds to the SAR upper limit value specified in the SAR standard; or
determining whether a distance between a human body and the second antenna is greater than a second detection distance, and
wherein the method further comprises:
obtaining a transmission performance parameter of the second antenna when the transmit power of the second antenna is less than the second preset power or the distance between the human body and the second antenna is greater than the second detection distance; and
prolonging a length of the second time period according to the transmission performance parameter of the second antenna.

11. The method of claim 1, wherein after detecting that the transmit power of the first antenna is greater than the first preset power, the method further comprises:
detecting a distance between a human body and the first antenna;
determining Whether the distance between the human body and the first antenna is less than a first detection distance, wherein the first detection distance is a distance between the wireless communications device and the human body during the SAR test specified in the SAR standard; and
stop using the first antenna and start transmitting the radio frequency signal using the second antenna when the first time period elapses and when the transmit power of the first antenna is greater than the first preset power and the distance between the human body and the first antenna is less than the first detection distance.

12. The method of claim 1, wherein the length of the first time period is preset in the wireless communications device.

13. The method of claim 12, wherein stop using the first antenna and start transmitting the radio frequency signal using the second antenna comprises:
start counting a duration of transmitting the radio frequency signal using the first antenna when the transmit power of the first antenna is greater than the first preset power; and
stop using the first antenna and start transmitting the radio frequency signal using the second antenna when the duration of transmitting the radio frequency signal using the first antenna reaches the length of the first time period.

14. The method of claim 1, wherein radio-frequency radiation energy generated when the radio frequency signal is transmitted using the first antenna in the first time period is less than or equal to first preset energy, and wherein the first preset energy is equal to or less than radio-frequency radiation energy at the first antenna and corresponds to the SAR upper limit value specified in the SAR standard.

15. A wireless communications device, comprising:
a first antenna configured to transmit a radio frequency signal;
a second antenna configured to transmit the radio frequency signal, wherein the first antenna has a first radius (x) of a first hotspot area, wherein the second antenna has a second radius (y) of a second hotspot area, wherein a unit measurement cube of an absorber has a length (z), wherein a distance (d) between positions of the first antenna and the second antenna in the wireless communications device is greater than a sum of x and y when the sum of x and y is greater than or equal to z, and wherein d is greater than z when the sum of x and y is less than z;
a radio frequency circuit communicatively coupled to the first antenna and the second antenna; and
a processor communicatively coupled to the radio frequency circuit and configured to:
transmit, using the radio frequency circuit and the first antenna, the radio frequency signal; and
instruct the radio frequency circuit to stop using the first antenna and to start transmitting the radio frequency signal using the second antenna to enable the wireless communications device to meet a specific absorption rate (SAR) standard when transmit power of the first antenna is greater than first preset power and a first time period elapses, wherein the first preset power is equal to or less than transmit power corresponding to an SAR upper limit value specified in the SAR standard, wherein a start moment of the first time period is a moment when the transmit power of the first antenna is greater than the first preset power, and wherein a length of the first time period is less than test duration of an SAR test specified in the SAR standard.

16. The wireless communications device of claim 15, wherein the processor is further configured to monitor whether the transmit power of the first antenna is greater than the first preset power.

17. The wireless communications device of claim 15, wherein when a second time period elapses, the processor is further configured to:
stop transmitting, using the radio frequency circuit and the second antenna, the radio frequency signal; and
start transmitting, using the radio frequency circuit and another antenna, the radio frequency signal, wherein a start moment of the second time period is a moment when the second antenna starts transmitting the radio frequency signal, and wherein the other antenna is an antenna other than the second antenna in the wireless communications device.

18. The wireless communications device of claim 17, wherein the other antenna is the first antenna.

19. The wireless communications device of claim 15, further comprising a first sensor coupled to the processor and configured to detect a distance between a human body and the first antenna, wherein the processor is further configured to:
determine whether the distance between the human body and the first antenna is less than a first detection distance, wherein the first detection distance is a distance between the wireless communications device and the human body during the SAR test specified in the SAR standard; and
stop using the first antenna and start transmitting the radio frequency signal using the second antenna when the first time period elapses and when the transmit power of the first antenna is greater than the first preset power and the distance between the human body and the first antenna is less than the first detection distance.

20. The wireless communications device of claim 15, wherein the length of the first time period is preset in the wireless communications device.

* * * * *